(12) United States Patent
Tortorelli et al.

(10) Patent No.: US 10,665,298 B2
(45) Date of Patent: May 26, 2020

(54) TECHNIQUES TO ACCESS A SELF-SELECTING MEMORY DEVICE

(71) Applicant: Micron Technology, Inc., Boise, ID (US)

(72) Inventors: Innocenzo Tortorelli, Cernusco Sul Naviglio (IT); Andrea Redaelli, Casatenovo (IT); Agostino Pirovano, Milan (IT); Fabio Pellizzer, Boise, ID (US); Mario Allegra, Milan (IT); Paolo Fantini, Vimercate (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/419,821

(22) Filed: May 22, 2019

(65) Prior Publication Data

US 2019/0362789 A1    Nov. 28, 2019

Related U.S. Application Data

(63) Continuation of application No. 15/842,504, filed on Dec. 14, 2017, now Pat. No. 10,381,075.

(51) Int. Cl.
*G11C 13/02*    (2006.01)
*G11C 13/00*    (2006.01)
(Continued)

(52) U.S. Cl.
CPC ...... *G11C 13/0069* (2013.01); *G11C 11/5678* (2013.01); *G11C 13/0004* (2013.01);
(Continued)

(58) Field of Classification Search
CPC .......... G11C 11/5678; G11C 13/0004; G11C 13/004; G11C 13/0069; G11C 2213/30; G11C 2213/71; H01L 45/141
(Continued)

(56) References Cited

U.S. PATENT DOCUMENTS 8,077,506 B2   12/2011   Lee et al.
8,934,280 B1   1/2015    Kuo et al.
(Continued)

OTHER PUBLICATIONS

IPO, "Office Action," issued in connection with ROC (Taiwan) Patent Application No. 107141585, dated Jun. 28, 2019 (10 pages).
(Continued)

*Primary Examiner* — Ly D Pham
(74) *Attorney, Agent, or Firm* — Holland & Hart LLP

(57) ABSTRACT

Methods, systems, and devices related to techniques to access a self-selecting memory device are described. A self-selecting memory cell may store one or more bits of data represented by different threshold voltages of the self-selecting memory cell. A programming pulse may be varied to establish the different threshold voltages by modifying one or more time durations during which a fixed level of voltage or current is maintained across the self-selecting memory cell. The self-selecting memory cell may include a chalcogenide alloy. A non-uniform distribution of an element in the chalcogenide alloy may determine a particular threshold voltage of the self-selecting memory cell. The shape of the programming pulse may be configured to modify a distribution of the element in the chalcogenide alloy based on a desired logic state of the self-selecting memory cell.

20 Claims, 12 Drawing Sheets

(51) Int. Cl.
*G11C 11/56* (2006.01)
*H01L 27/24* (2006.01)
*H01L 45/00* (2006.01)

(52) U.S. Cl.
CPC ........ *G11C 13/004* (2013.01); *G11C 13/0038* (2013.01); *G11C 13/0061* (2013.01); *H01L 27/2463* (2013.01); *G11C 13/0026* (2013.01); *G11C 13/0028* (2013.01); *G11C 2013/0052* (2013.01); *G11C 2013/0092* (2013.01); *G11C 2213/30* (2013.01); *G11C 2213/71* (2013.01); *H01L 45/1253* (2013.01); *H01L 45/141* (2013.01)

(58) Field of Classification Search
USPC .......................................................... 365/46
See application file for complete search history.

(56) References Cited

U.S. PATENT DOCUMENTS

| | | | |
|---|---|---|---|
| 9,620,713 | B2 | 4/2017 | Pellizzer |
| 9,697,913 | B1 | 7/2017 | Mariani et al. |
| 9,799,381 | B1 | 10/2017 | Tortorelli et al. |
| 10,008,665 | B1 | 6/2018 | Gealy et al. |
| 10,128,437 | B1 | 11/2018 | Fantini et al. |
| 2009/0257275 | A1* | 10/2009 | Karpov .............. G11C 13/0004 365/163 |
| 2010/0091559 | A1 | 4/2010 | Parkinson |
| 2010/0149856 | A1 | 6/2010 | Tang |
| 2010/0284211 | A1 | 11/2010 | Hennessey |
| 2011/0122685 | A1 | 5/2011 | Kang et al. |
| 2013/0135924 | A1 | 5/2013 | Pantazi et al. |
| 2014/0269043 | A1 | 9/2014 | Chu |
| 2015/0155045 | A1 | 6/2015 | Yano |
| 2016/0315120 | A1 | 10/2016 | Sumino |
| 2017/0125097 | A1 | 5/2017 | Tortorelli et al. |
| 2017/0148851 | A1 | 5/2017 | Hsu |
| 2017/0338282 | A1* | 11/2017 | Meotto ............... H01L 27/2472 |
| 2018/0040370 | A1 | 2/2018 | Tortorelli et al. |
| 2018/0122468 | A1 | 5/2018 | Pirovano et al. |
| 2018/0286921 | A1 | 10/2018 | Redaelli et al. |
| 2018/0315475 | A1 | 11/2018 | Redaelli et al. |
| 2019/0067571 | A1 | 2/2019 | Fratin et al. |

OTHER PUBLICATIONS

ISA/KR, International Search Report and Written Opinion of the International Searching Authority, Int'l Appl. No. PCT/US2018/063116, dated Mar. 21, 2019, Korean Intellectual Property Office, Seo-gu, Daejeon, Republic of Korea, 14 pgs.

Chen, et al., "An Access-Transistor-Free (0T/1R) Non-Volatile Resistance Random Access Memory (RRAM) Using a Novel Threshold Switching, Self-Rectifying Chalcogenide Device", Electron Devices Meeting, 2003. IEDM '03 Technical Digest. IEEE International, Dec. 8-10, 2003, IEEE, 4 pgs.

\* cited by examiner

TECHNIQUES TO ACCESS A SELF-SELECTING MEMORY DEVICE

CROSS REFERENCE

The present Application for Patent is a continuation of U.S. patent application Ser. No. 15/842,504 by Tortorelli et al., entitled "Techniques To Access A Self-Selecting Memory Device," filed Dec. 14, 2017, assigned to the assignee hereof, and is expressly incorporated by reference in its entirety herein.

BACKGROUND

The following relates generally to operating a memory array and more specifically to techniques to access a self-selecting memory device.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics. Storing one or more bits of information in a memory cell may be desired to increase a logical memory cell density without increasing a physical memory cell density to reduce a cost per bit.

DETAILED DESCRIPTION

Figure 1:
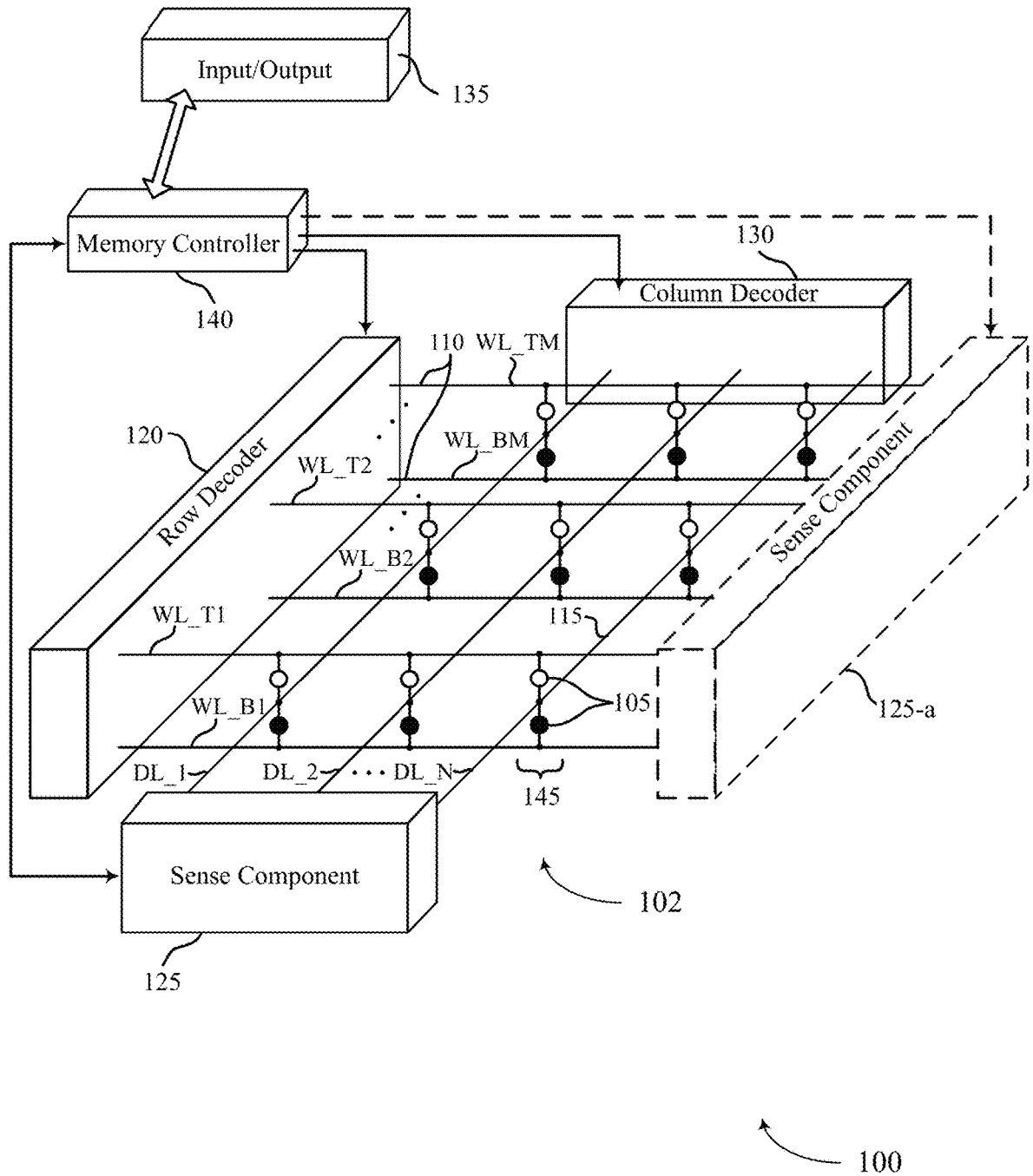
FIG. 1 illustrates an example of a memory device diagram having a three-dimensional array of memory cells that supports techniques to access a self-selecting memory device in accordance with embodiments of the present disclosure.

A self-selecting memory cell including a chalcogenide alloy may be programmed to store one or more bits of data by using various shapes of a programming pulse having a single polarity. Overall shapes of the programming pulse may be varied by changing a current or voltage amplitude of the programming pulse as well as modifying one or more durations during which a fixed level of voltage or a fixed level of current is maintained. In some cases, a shape of a programming pulse may include portions where the level of voltage or the level of current is changing (e.g., a ramp voltage, a ramp current).

The programming pulse may cause a constituent (which may also be referred to as an element or a part) of the chalcogenide alloy to migrate based on an electric field established by the programming pulse. An electric current flowing through the chalcogenide alloy may heat the alloy to facilitate migration of the constituent. As a result, a non-uniform distribution of the constituent in the alloy may develop, resulting in local variations in alloy compositions upon applying the programming pulse. When a read pulse is applied to the self-selecting memory cell, the self-selecting memory cell may exhibit a particular threshold voltage ($V_{TH}$) that may have been set by the local concentration of the constituent in the alloy. Hence, a number of threshold voltages (e.g., two or more $V_{TH}$ levels) of the self-selecting memory cell may be set to store one or more bits of data by determining and applying appropriate shapes of the programming pulse.

In some embodiments, different shapes of programming pulses may be used to establish different threshold voltage levels for a given chalcogenide alloy to enable a self-selecting memory device to store one or more bits of data. The shapes of the programming pulses may be configured based on the chalcogenide alloy used in the self-selecting memory cell. For example, a different chalcogenide alloy may be used in a self-selecting memory device in which the alloy is more suitable to locally modify compositions of the alloy responding to a programming pulse having a relatively simple shape. Other factors to consider in selecting a specific chalcogenide alloy for use in a self-selecting memory device or a multi-level self-selecting memory device may include a thermal stability of the alloy during a fabrication process, mechanical stability of the alloy during a fabrication process, electrical characteristics of a self-selecting memory device (e.g., a cycling performance, $V_{TH}$ stability over time, data retention capability, a leakage current level under de-selection bias), or a combination thereof.

Features of the disclosure introduced above are further described below in the context of memory array with a cross-point architecture. Specific examples are then described for operating the memory array related to techniques to access a self-selecting memory device in some embodiments. These and other features of the disclosure are further illustrated by and described with reference to apparatus diagrams, system diagrams, and flowcharts that relate to techniques to access a self-selecting memory device.

FIG. 1 illustrates an example memory device 100 in accordance with embodiments of the present disclosure. Memory device 100 may also be referred to as an electronic memory apparatus. FIG. 1 is an illustrative representation of various components and features of the memory device 100. As such, it should be appreciated that the components and features of the memory device 100 shown to illustrate functional interrelationships, not their actual physical positions within the memory device 100. In the illustrative example of FIG. 1, the memory device 100 includes a three-dimensional (3D) memory array 102. The 3D memory array 102 includes memory cells 105 that may be programmable to store different states. In some embodiments, each memory cell 105 may be programmable to store two states, denoted as a logic 0 and a logic 1. In some embodiments, a memory cell 105 may be configured to store more than two logic states. A memory cell 105 may, in some embodiments, include a self-selecting memory cell. Although some elements included in FIG. 1 are labeled with a numeric indicator, other corresponding elements are not labeled, though they are the same or would be understood to be similar, in an effort to increase visibility and clarity of the depicted features.

In some cases, the memory cell (e.g., self-selecting memory cell) may include a material that remains in an amorphous state that may have a threshold voltage associated with it—that is, a current may flow after an applied voltage exceeds the threshold voltage. Thus, if the applied voltage is less than the threshold voltage, no appreciable amount of current may flow. In some embodiments, the current flow or lack thereof, may be sensed by a sense component 125 as described with reference to FIG. 1 to read stored information in the selected memory cell. In some embodiments, the material may be a chalcogenide alloy. Composition of the chalcogenide alloy may be locally modified upon applying a programming pulse and the memory cell 105 may exhibit a certain number of different threshold voltage levels (e.g., two or more threshold voltage levels). Thus, the memory cell 105 may be able to store one or more bits of data. As discussed below, setting a logic state of the memory cell 105, represented by its threshold voltage, may be assisted by heating the memory element.

The 3D memory array 102 may include two or more two-dimensional (2D) memory arrays formed on top of one another. This may increase a number of memory cells that may be placed or created on a single die or substrate as compared with 2D arrays, which in turn may reduce production costs, or increase the performance of the memory device, or both. Based on the example depicted in FIG. 1, memory array 102 includes two levels of memory cells 105 and may thus be considered a 3D memory array; however, the number of levels is not limited to two. Each level may be aligned or positioned so that memory cells 105 may be aligned (exactly, overlapping, or approximately) with one another across each level, forming a memory cell stack 145. In some cases, the memory cell stack 145 may include multiple self-selecting memory cells laid on top of another while sharing an access line for both as explained below. In some cases, the self-selecting memory cells may be multi-level self-selecting memory cells configured to store more than one bit of data using multi-level storage techniques.

In some embodiments, each row of memory cells 105 is connected to an access line 110, and each column of memory cells 105 is connected to a bit line 115. Access lines 110 and bit lines 115 may be substantially perpendicular to one another and may create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third layer may share a access line 110 with a lower layer. In general, one memory cell 105 may be located at the intersection of two conductive lines such as a access line 110 and a bit line 115. This intersection may be referred to as a memory cell's address. A target memory cell 105 may be a memory cell 105 located at the intersection of an energized access line 110 and bit line 115; that is, access line 110 and bit line 115 may be energized in order to read or write a memory cell 105 at their intersection. Other memory cells 105 that are in electronic communication with (e.g., connected to) the same access line 110 or bit line 115 may be referred to as untargeted memory cells 105.

As discussed above, electrodes may be coupled to a memory cell 105 and an access line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some embodiments, a memory cell 105 may include a chalcogenide alloy positioned between a first electrode and a second electrode. One side of the first electrode may be coupled to an access line 110 and the other side of the first electrode to the chalcogenide alloy. In addition, one side of the second electrode may be coupled to a bit line 115 and the other side of the second electrode to the chalcogenide alloy. The first electrode and the second electrode may be the same material (e.g., carbon) or different.

Operations such as reading and writing may be performed on memory cells 105 by activating or selecting access line 110 and digit line 115. In some embodiments, access lines 110 may also be known as word lines 110, and bit lines 115 may also be known digit lines 115. References to word lines and bit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

In some architectures, the logic storing device of a cell (e.g., a resistor in a PCM cell, a capacitor in a FeRAM cell) may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. Upon selecting a memory cell 105, the resulting signal may be used to determine the stored logic state. In some cases, a first logic state may correspond to no current or a negligibly small current, whereas a second logic state may correspond to a finite current. In some cases, a memory cell 105 may include a self-selecting memory cell having two terminals and may not need a separate selection component. As such, one terminal of the self-selecting memory cell may be electrically connected to a word line 110 and the other terminal of the self-selecting memory cell may be electrically connected to a digit line 115.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate digit line 115. For example, memory array 102 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

In some embodiments, a series of predetermined voltages may be applied to determine one of two or more threshold voltage levels stored in a self-selecting memory cell. The predetermined voltage levels may increase in magnitude to detect a particular threshold voltage of the self-selecting memory cell in linear mode. Alternatively, the predetermined voltage levels may increase or decrease in magnitude to detect a particular threshold voltage of the self-selecting memory cell in a binary search mode. The predetermined voltage levels may have a same polarity with a voltage used to program the self-selecting memory cell. The predetermined voltage levels may have an opposite polarity with a voltage used to program the self-selecting memory cell. A range of the predetermined voltage may be determined by a range of the threshold voltage of the self-selecting memory cell.

Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. FIG. 1 also shows an alternative option of arranging the sense component 125-a (in a dashed box). An ordinary person skilled in the art would appreciate that sense component may be associated either with column decoder or row decoder without losing its functional purposes.

A memory cell 105 may be set or written by similarly activating the relevant word line 110 and digit line 115 and at least one logic value may be stored in the memory cell 105. Column decoder 130 or row decoder 120 may accept data, for example input/output 135, to be written to the memory cells 105. In the case of a self-selecting memory cell including a chalcogenide alloy, a memory cell 105 may be written to store data by applying a programming pulse having a single polarity, for example, by modifying a local composition of the alloy. The programming pulse may have various shapes depending on a specific threshold voltage to be established at the self-selecting memory cell. This process is discussed in more detail below with reference to FIGS. 4 through 6.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written. But in non-volatile memory, such as self-selecting memory, PCM, FeRAM, or 3D NAND memory, accessing the memory cell 105 may not destroy the logic state and, thus, the memory cell 105 may not require re-writing after accessing.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory device 100. For example, the memory controller 140 may determine a desired logic state of a self-selecting memory cell and a shape of a programming pulse having a single polarity based on a threshold voltage corresponding to the desired logic state of the self-selecting memory cell, and apply the programming pulse to the self-selecting memory cell. In general, the amplitude, shape, or duration of an applied voltage or current discussed herein may be adjusted or varied and may be different for the various operations discussed in operating the memory device 100. Furthermore, one, multiple, or all memory cells 105 within memory array 102 may be accessed simultaneously; for example, multiple or all cells of memory array 102 may be accessed simultaneously during a reset operation in which all memory cells 105, or a group of memory cells 105, are set to a single logic state.

Figure 2:
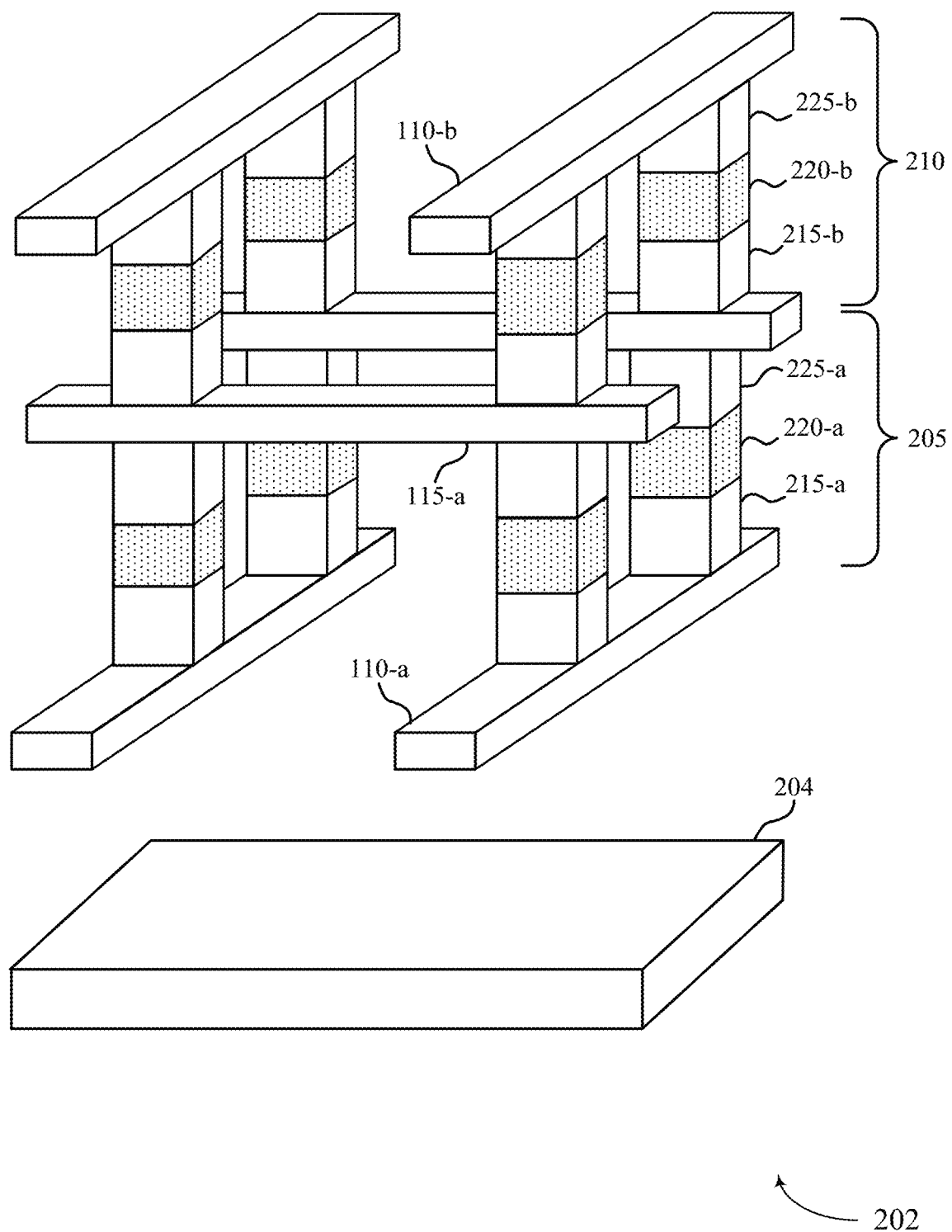
FIG. 2 illustrates an example of a three-dimensional memory array that supports techniques to access a self-selecting memory device in accordance with embodiments of the present disclosure.

FIG. 2 illustrates an example of a 3D memory array 202 that supports techniques to access a self-selecting memory device in accordance with embodiments of the present disclosure. Memory array 202 may be an example of portions of memory array 102 described with reference to FIG. 1. Memory array 202 may include a first array or deck 205 of memory cells that is positioned above a substrate 204 and second array or deck 210 of memory cells on top of the first array or deck 205. Memory array 202 may also include word line 110-*a* and word line 110-*b*, and bit line 115-*a*, which may be examples of word line 110 and bit line 115, as described with reference to FIG. 1. Memory cells of the first deck 205 and the second deck 210 each may have one or more self-selecting memory cell. Although some elements included in FIG. 2 are labeled with a numeric indicator, other corresponding elements are not labeled, though they are the same or would be understood to be similar, in an effort to increase visibility and clarity of the depicted features.

Self-selecting memory cells of the first deck 205 may include first electrode 215-*a*, chalcogenide alloy 220-*a*, and second electrode 225-*a*. In addition, self-selecting memory cells of the second memory deck 210 may include a first electrode 215-*b*, chalcogenide alloy 220-*b*, and second electrode 225-*b*. The self-selecting memory cells of the first deck 205 and second deck 210 may, in some embodiments, have common conductive lines such that corresponding self-selecting memory cells of each deck 205 and 210 may share bit lines 115 or word lines 110 as described with reference to FIG. 1. For example, first electrode 215-*b* of the second deck 210 and the second electrode 225-*a* of the first deck 205 may be coupled to bit line 115-*a* such that bit line 115-*a* is shared by vertically adjacent self-selecting memory cells.

The architecture of memory array 202 may be referred to as a cross-point architecture in which a memory cell is formed at a topological cross-point between a word line and a bit line as illustrated in FIG. 2. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F$^2$ memory cell area, where F is the smallest feature size, compared to other architectures with a 6F$^2$ memory cell area, such as those with a three-terminal selection component. For example, DRAM may use a transistor, which is a three-terminal device, as the selection component for each memory cell and may have a larger memory cell area compared to the cross-point architecture.

In some architectures (not shown), a plurality of word lines may be formed on parallel planes or tiers parallel to a substrate. The plurality of word lines may be configured to include a plurality of holes to allow a plurality of bit lines formed orthogonally to the planes of word lines such that each of the plurality of bit lines penetrates through a vertically aligned set of holes (e.g., the bit lines vertically disposed with respect to the planes of word lines and the horizontal substrate). Memory cells including storage element (e.g., self-selecting memory cells including a chalcogenide alloy) may be formed at the crossings of word lines and bit lines (e.g., spaces between the word lines and the bit line in the vertically aligned set of holes). In a similar fashion as described above with reference to FIG. 1, the memory cells (e.g., self-selecting memory cells including a chalcogenide alloy) may be operated (e.g., read and/or programmed) by selecting respective access lines (e.g., a bit line and a word line) and applying voltage or current pulses.

While the example of FIG. 2 shows two memory decks, other configurations are possible. In some embodiments, a single memory deck of self-selecting memory cells may be constructed above a substrate 204, which may be referred to as a two-dimensional memory. In some embodiments, a three or four memory decks of memory cells may be configured in a similar manner in a three-dimensional cross point architecture. In some embodiments, one or more of the memory decks may include self-selecting memory cells that include chalcogenide alloy 220. Chalcogenide alloys 220 may, for example, include a chalcogenide glass such as, for example, an alloy of selenium (Se), tellurium (Te), arsenic (As), antimony (Sb), carbon (C), germanium (Ge), and silicon (Si). In some embodiment, a chalcogenide alloy having primarily selenium (Se), arsenic (As), and germanium (Ge) may be referred to as SAG-alloy. In some embodiments, SAG-alloy may include silicon (Si) and such chalcogenide alloy may be referred to as SiSAG-alloy. In some embodiments, the chalcogenide glass may include additional elements such as hydrogen (H), oxygen (O), nitrogen (N), chlorine (Cl), or fluorine (F), each in atomic or molecular forms.

In some embodiments, a self-selecting memory cell including chalcogenide alloy 220 may be programmed to exhibit a particular threshold voltage by applying a programming pulse to the self-selecting memory cell using a bit line 115 and a word line 110. The particular threshold voltage, one of two or more threshold voltage levels, may be established by modifying a local composition of chalcogenide alloy 220. In some embodiments, selenium may exhibit a non-uniform concentration profile within the chalcogenide alloy 220, thus modifying a local composition of the chalcogenide alloy 220, in response to the applied programming pulse. The programming pulse may have various shapes (e.g., multiple voltage or current levels and time durations) depending on a specific threshold voltage level intended for the self-selecting memory cell. Subsequently, in some embodiments, a series of read pulses having predetermined voltages may be applied to the self-selecting memory cell using the bit line 115 and the word line 110. The predetermined voltage levels of the read pulses may increase or decrease in magnitude to detect the particular threshold voltage of the self-selecting memory cell. In some embodiments, the predetermined voltage of the read pulse may have a same polarity with the voltage of the programming pulse used to program the self-selecting memory cell. In some embodiments, the predetermined voltage of the read pulse may have an opposite polarity with the voltage of the programming pulse used to program the self-selecting memory cell.

Figure 3:
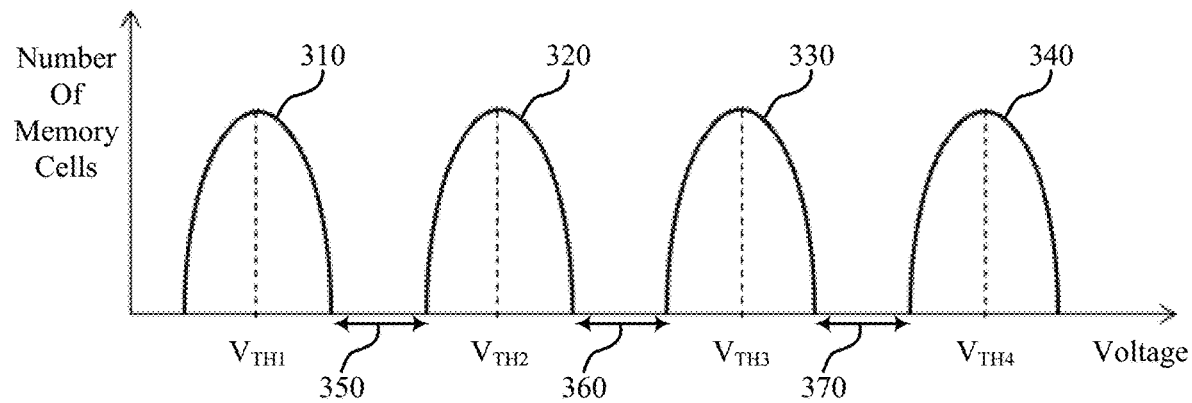
FIG. 3 illustrates examples of threshold voltage distributions that supports techniques to access a self-selecting memory device in accordance with embodiments of the present disclosure.

FIG. 3 illustrates examples of memory cell threshold voltage ($V_{TH}$) distributions 300 that supports techniques to access a self-selecting memory device in accordance with embodiments of the present disclosure. A self-selecting memory cell may be configured to store a logic state that includes multiple bits of data using a multi-level storage techniques. In some self-selecting memory cells, a chalcogenide alloy may be modified to achieve the different threshold voltages for multi-level storage. When modifying the alloy in such a way, the exact voltage threshold for a logic state may vary from an expected value according to a distribution. The $V_{TH}$ distributions 300 show how the voltage thresholds may vary around a median value in a self-selecting memory cell.

$V_{TH}$ distributions 300 depict a number of memory cells (y-axis) with a certain $V_{TH}$ as a function of threshold voltages (x-axis) of one or more memory cells. In some embodiments, self-selecting memory cells may include a chalcogenide alloy as described with reference to FIGS. 1 and 2. $V_{TH}$ distributions 300 may represent a multi-level cell operation scheme of storing at least two-bits per cell. A distribution 310 may exhibit a median $V_{TH}$ value of $V_{TH1}$. Similarly, distributions 320, 330, and 340 may exhibit median $V_{TH}$ values of $V_{TH2}$, $V_{TH3}$, and $V_{TH4}$, respectively. The distributions 310, 320, 330, and 340 may represent one of four logic states, namely 00, 01, 10, and 11, respectively, storing two bits per cell. In some embodiments, two distributions may have an overlapping portion, thus may not have clear separation between the two distributions. In some embodiments, each distribution may not be symmetrical around its median $V_{TH}$. In some embodiments, each distribution may exhibit a different ranges of $V_{TH}$ values.

A voltage difference between the highest voltage of a distribution (e.g., distribution 310) and the lowest voltage of an adjacent distribution (e.g., distribution 320) may be referred to as a read window (e.g., read window 350). In some embodiments, a read window may be positive or negative. In some embodiments, a read window may be related to a voltage level associated with a read pulse. For example, a voltage level of a read pulse applied to a self-selecting memory cell should fall within a read window (e.g., read window 350) to determine whether the self-selecting memory cell exhibits a threshold voltage lower than the voltage of the real pulse (e.g., the threshold voltage that may be a part of $V_{TH}$ distribution 310) or higher (e.g., the threshold voltage that may be a part of $V_{TH}$ distribution 320, $V_{TH}$ distribution 330, or $V_{TH}$ distribution 340). Such determination may be made based on whether the self-selecting memory cell turned on upon applying the read pulse (e.g., $V_{TH}$ of the self-selecting memory cell is lower than the voltage of the read pulse). When the self-selecting memory cell does not turn on (e.g., $V_{TH}$ of the self-selecting memory cell is higher than the voltage of the read pulse), the voltage of the read pulse may be increased to a value (e.g., a value corresponding to read window 360 or read window 370) to determine the particular $V_{TH}$ of the self-selecting memory cell that may be a part of the distributions 320, 330, or 340.

In some embodiments, local variations in composition of the chalcogenide alloy may produce different $V_{TH}$ values of self-selecting memory cells (e.g., $V_{TH1}$, $V_{TH2}$, $V_{TH3}$, or $V_{TH4}$). Variations in programming pulse shapes as illustrated in FIG. 4 may be applied to self-selecting memory cells to produce the local variations in composition of the chalcogenide alloy by modifying a strength of electric field to migrate an element (e.g., selenium) of a chalcogenide alloy while the alloy may be heated by a current flowing though the alloy.

Figure 4:
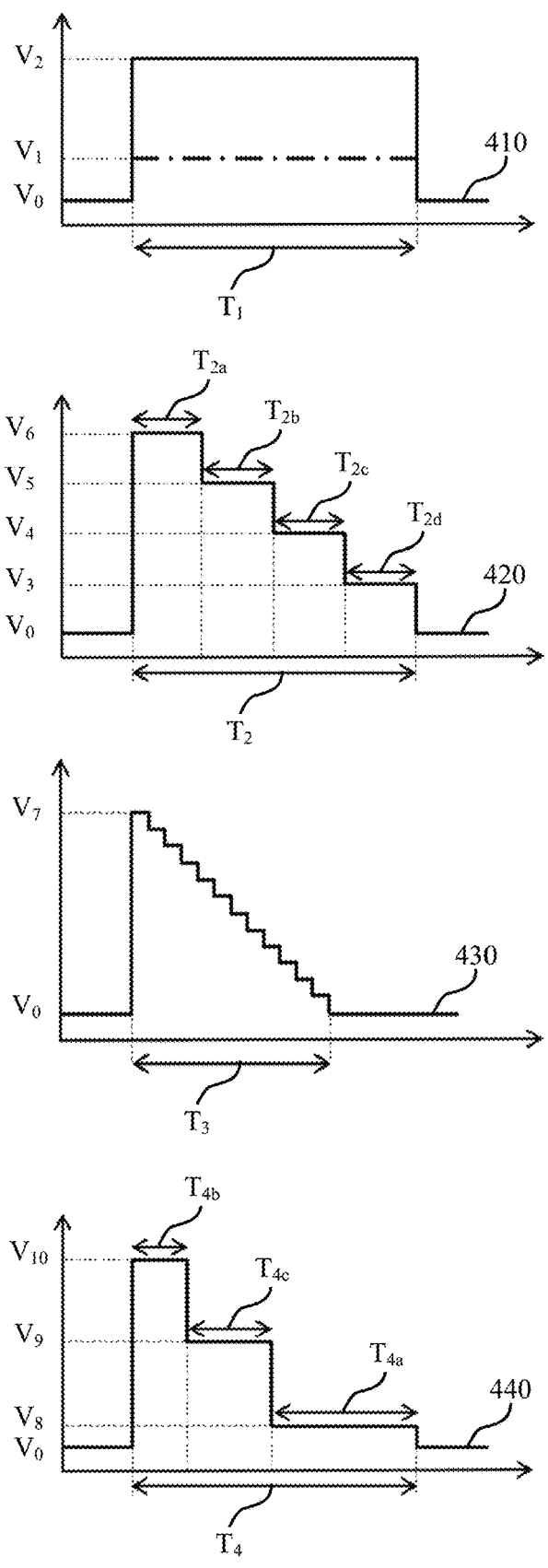
FIG. 4 illustrates embodiments of electrical pulses that supports techniques to access a self-selecting memory device in accordance with embodiments of the present disclosure.

FIG. 4 illustrates examples of electrical pulses 400 that supports techniques to access a self-selecting memory device in accordance with various embodiments of the present disclosure. The electrical pulses of 400 depict various shapes of either voltage or current (y-axis) applied to the self-selecting memory cells with respect to time (x-axis). Various shapes may be determined for a programming pulse applied to self-selecting memory cells. Some following examples describe various shapes of programming pulses applied to self-selecting memory cells in voltage levels for illustration purpose. It should be appreciated that various shapes of programming pulses applied to self-selecting memory cells in current levels may be similarly used without losing functionality.

A pulse 410 may be referred to as a rectangular pulse having a single time duration $T_1$ during which a fixed level of voltage amplitude $V_1$ or $V_2$ is maintained. A voltage $V_0$ represents a baseline of pulses and may, in some embodiments, be at a first voltage (e.g., ground, virtual ground, approximately 0 V). In some embodiments, $T_1$ may range between few nano-seconds (nsec) up to a micro-second (µsec) long, e.g., 10 nsec to 1 µsec. In some embodiments, $V_1$ may correspond to a current level in the range of tens of micro-amps (µA) flowing through a self-selecting memory cell while $V_2$ to a current level from tens to hundreds µA flowing through a self-selecting memory cell. In some embodiments, a self-selecting memory cell with a chalcogenide alloy having a particular composition (e.g., SAG-based alloy) may not exhibit appreciable differences in threshold voltages upon receiving the rectangular pulse 410 with $V_1$ or the rectangular pulse 410 with $V_2$. The behavior of SAG-based chalcogenide alloy may be attributable to its amorphous structure and may require more significant changes in the rectangular pulse amplitude to initiate appreciable net changes in a spatial profile distribution of an element of the alloy (e.g., selenium). In some embodiments, on the contrary, a self-selecting memory cell with SiSAG-based chalcogenide alloy may exhibit appreciable differences in threshold voltages upon applying the rectangular pulse 410 with $V_1$ or the rectangular pulse 410 with $V_2$. In some cases, application of rectangular pulses with intermediate amplitudes between $V_1$ and $V_2$ (not shown) may result in intermediate threshold voltages as described in more detail below. In some embodiments, a current level resulting in an appreciable difference in a threshold voltage of a self-selecting memory cell may vary depending on a physical size of the self-selecting memory cell, a chalcogenide alloy used in the self-selecting memory cell, or a combination thereof.

A pulse 420 may be referred to as a staircase-down pulse having more than one time durations (e.g., four time durations, $T_{2a}$, $T_{2b}$, $T_{2c}$, and $T_{2d}$) during which a fixed level of voltage amplitude (e.g., $V_3$, $V_4$, $V_5$, or $V_6$) is maintained. Overall time duration $T_2$ may be a sum of the more than one time durations. In some embodiments, $T_2$ may be a few nsec or a sec long, e.g., 50 nsec to 1 µsec. Correspondingly, each time duration, e.g., $T_{2a}$, $T_{2b}$, $T_{2c}$, and $T_{2d}$ may be approximately few nsec to 1 µsec long. In some embodiments, each time durations may be different. In some embodiments, an overall current level of approximately tens or hundreds of A may flow through a self-selecting memory cell. In some cases, pulse 420 may be modified to be a staircase-up pulse.

A self-selecting memory cell with a chalcogenide alloy having a particular composition (e.g., SAG-based alloy) may exhibit appreciable differences in threshold voltages upon receiving the staircase-down pulse 420 or the rectangular pulse 410 with different $V_2$ levels to program the self-selecting memory cell. The behavior of SAG-based chalcogenide alloy exhibiting a different threshold voltage may be attributable to an appreciable net change in a spatial profile distribution of an element of the alloy (e.g., selenium). Such changes in the spatial profile distribution may occur when the staircase-down pulse 420 is applied, at least in part due to a stronger electric field across the alloy corresponding to the voltage amplitude $V_6$ during the time duration $T_{2a}$ when compared to the voltage amplitude $V_2$ of the rectangular pulse 410. The electric field during the remaining time durations of the staircase-down pulse 420, e.g., $T_{2b}$, $T_{2c}$, and $T_{2d}$ may further facilitate movements of the element (e.g., selenium) while a current flowing through the chalcogenide alloy may provide a heat energy to assist the movements of the element (e.g., selenium). Thus, various shapes of programming pulse may be used to have a specific chalcogenide alloy to exhibit different threshold voltages so as to store one or more bits of data. In some embodiments, the fixed voltage levels associated with the time durations may be increased or decreased to establish a certain threshold voltage of the self-selecting memory cell. In some embodiments, a staircase-up pulse may be used to store one or more bits of data in a self-selecting memory cell.

A pulse 430 may be referred to as a downward triangular pulse. The pulse 430 may be regarded as an extreme case of the pulse 420 where a number of time durations are increased and differences between each fixed voltage level maintained during each time duration is decreased. In some embodiments, the voltage (or current) amplitude of the downward triangular pulse may change with continuity (not shown), e.g., without steps. It should be appreciated that the pulse 430 may be modified to be an upward triangular pulse. In some embodiments, an upward triangular pulse may be used as a read pulse. For example, when an upward triangular read pulse is applied to a self-selecting memory cell, the time duration for the self-selecting memory cell takes to turn on (i.e., when the voltage level of the upward triangular read pulse becomes larger than a particular threshold voltage of the self-selecting memory cell) may correspond to the particular threshold voltage of the self-selecting memory cell. Hence, determining a particular logic state associated with the particular threshold voltage of the self-selecting memory cell may be feasible by applying an upward triangular read pulse and monitoring a time duration elapsed for the self-selecting memory cell to turn on.

A maximum voltage level of the upward triangular read pulse (e.g., $V_7$) may be determined based on the highest threshold voltage associated a logic state stored in the self-selecting memory cell. A range of voltage level associated with the upward triangular read pulse (e.g., difference between $V_7$ and $V_0$) may be determined based on the range of threshold voltages associated with logic states stored in the self-selecting memory cell (e.g., distribution 310 through distribution 340). Time duration $T_3$ may be determined based on the range of voltage levels and the granularity of threshold voltage placement during a programming operation. As an example, assuming the total range of threshold voltages representing four logic states remains the same, if a read window is relatively large (e.g., read window 350 in FIG. 3 may be relatively large indicating that threshold voltage distributions 310 and 320 may be relatively tight around their median voltages $V_{TH1}$ and $V_{TH2}$), then the differences between each fixed voltage levels in the pulse 430 may be relatively large and $T_3$ may be relative short when compared to a case where a read window is relatively small (e.g., read window 350 in FIG. 3 may be relatively small indicating that the distributions 310 and 320 may be relatively broad around their median voltages $V_{TH1}$ and $V_{TH2}$).

A pulse 440 may represent a shape of a programming pulse determined to produce a particular threshold voltage of a self-selecting memory cell including a particular kind of a chalcogenide alloy (e.g., SiSAG-based chalcogenide alloy). In some embodiments, overall time duration $T_4$ may be tens of nsec up to a μsec long, e.g., 50 nsec to 1 μsec, similar to $T_1$ or $T_2$. Voltage levels (e.g., $V_5$, $V_9$, or $V_{10}$) may be determined by the desired particular threshold voltage of the self-selecting memory cell. Overall current level flowing through the self-selecting memory cell during $T_4$ may vary from 20 μA to hundreds of A with a certain number of intermediate values. Each time duration $T_{4a}$, $T_{4b}$, $T_{4c}$ may be equal or different. Number of time durations may be three as illustrated in the pulse 440 or smaller as illustrated in the pulse 410 or larger as illustrated in the pulse 420. In some embodiments, a memory controller may determine a desired logic state and a corresponding threshold voltage of a self-selecting memory cell, the desired logic state representing one or more bits of data. The memory controller may determine a shape of a programming pulse in order to obtain the threshold voltage of the self-selecting memory cell. Such determination of the shape of the programming pulse may include determining one or more time durations during which a fixed voltage amplitude is maintained or varying a current level flowing through the self-selecting memory cell to cause variations of the shape of the programming pulse when the programming pulse is applied to the self-selecting memory cell.

As illustrated above, various pulse shapes of a programming pulse may be used to store one or more bits of data in a self-selecting memory cell. A complex pulse shape (e.g., the pulse 420, the pulse 440, or a combination of the various pulses) may be desirable to establish two or more unique threshold voltage distributions for a given chalcogenide alloy (e.g., SAG-based alloy). On the contrary, a simple pulse shape (e.g., the pulse 410) may be used to establish two or more unique threshold voltage distributions for another chalcogenide alloy (e.g., SiSAG-based alloy). As discussed above, a choice of a particular chalcogenide alloy for designing a self-selecting memory device may include other considerations, such as a thermal and a mechanical stability of the alloy during a fabrication process and electrical characteristics of self-selecting memory devices (e.g., a cycling performance, $V_{TH}$ stability over time, data retention capability, a leakage current level under de-selection bias), or a combination thereof.

Figure 5:
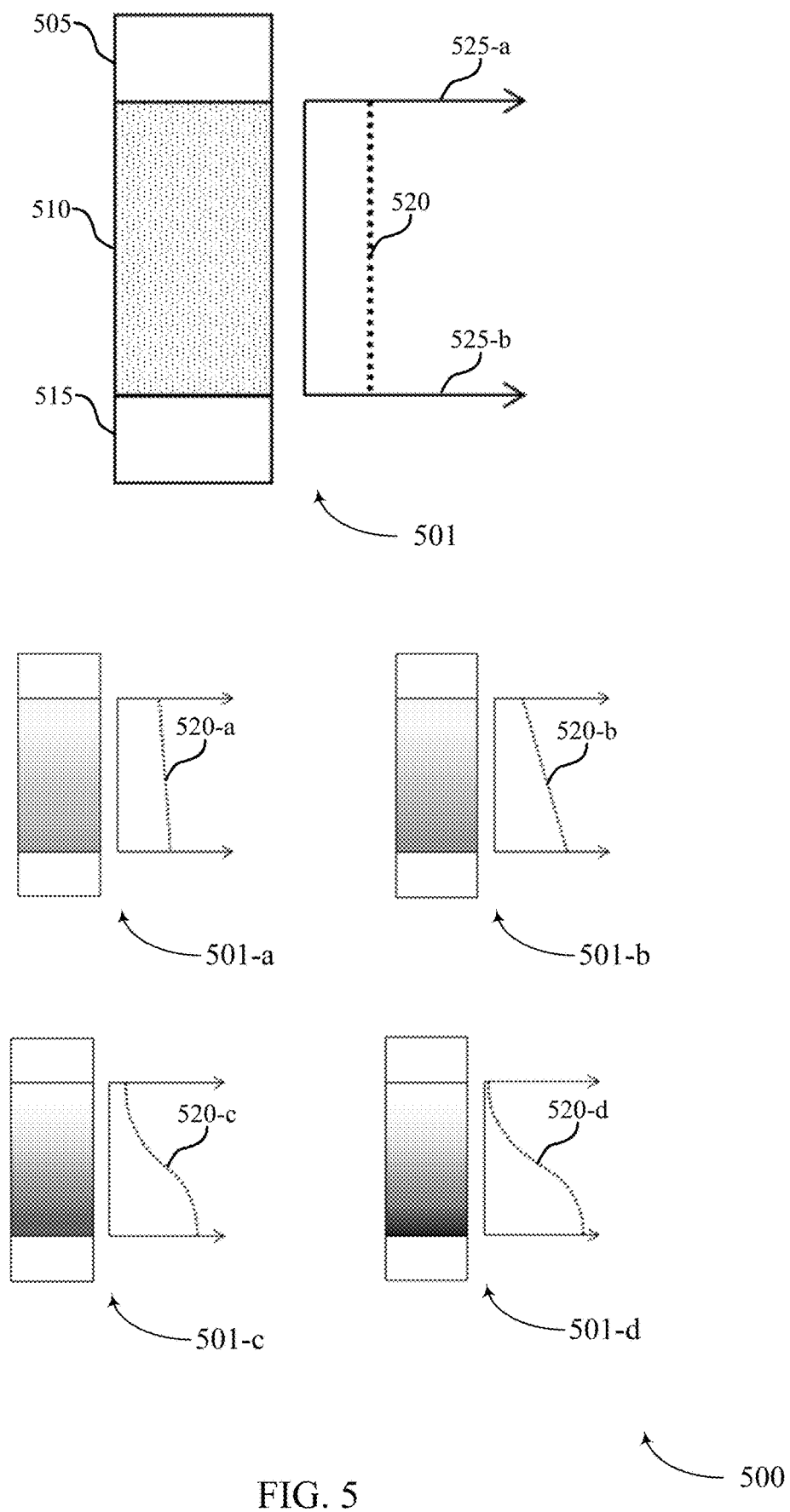
FIG. 5 illustrates examples of spatial distributions of a constituent of a chalcogenide alloy that supports techniques to access a self-selecting memory device in accordance with embodiments of the present disclosure.

FIG. 5 illustrates diagrams of spatial distributions 500 of a constituent of a chalcogenide alloy that support techniques to access a self-selecting memory device in accordance with various embodiments of the present disclosure. The spatial distributions 500 of the constituent of the chalcogenide alloy may be set by a programming pulse applied during an access operation of the self-selecting memory cell. The spatial distributions 500 may determine a threshold voltage of the self-selecting memory cell and the threshold voltage of the self-selecting memory cell may determine the logic state stored on the self-selecting memory cell.

Diagram 501 illustrates a chalcogenide alloy 510 positioned between a first electrode 505 and a second electrode 515. A composite stack of the chalcogenide alloy 510, the first electrode 505, and the second electrode 515 may be an example of a portion of the self-selecting memory device (e.g., the composite stack including 225-a, 220-a, and 215-a) illustrated with reference to FIG. 2. In some embodiments, diagram 501 may illustrate a spatial distribution of a constituent (e.g., selenium) in a SiSAG-based chalcogenide alloy. A uniform shading of the chalcogenide alloy 510 may represent a uniform distribution of selenium within the chalcogenide alloy 510 when the self-selecting memory device is fabricated without experiencing an electrical stress. A spatial profile of a constituent (e.g., selenium) of the chalcogenide alloy 510 between the first electrode 505 and the second electrode 515 may be represented as a concentration of the constituent (e.g., selenium) as a function of distance from the first electrode 505 or the second electrode 515. The concentration may be represented in axes, 525-a indicating a first interface between the chalcogenide alloy 510 and the first electrode 505, and 525-b indicating a second interface between the chalcogenide alloy 510 and the second electrode 515 as illustrated in FIG. 5. A concentration profile 520 may represent a uniform distribution of the constituent (e.g., selenium) when the self-selecting memory device is fabricated without experiencing an electrical stress. Although some elements included in FIG. 5 are labeled with a numeric indicator, other corresponding elements are not labeled, though they are the same or would be understood to be similar, in an effort to increase visibility and clarity of the depicted features.

A programming pulse having a single polarity may be applied to the chalcogenide alloy 510 to program the self-selecting memory cell. The programming pulse may be one of various pulse shapes illustrated with reference to FIG. 4. The programming pulse may be applied to the chalcogenide alloy 510 using a voltage difference between the first electrode 505 electrically connected to an access line (e.g., bit line 115-a as illustrated with reference to FIG. 2) and the second electrode 515 electrically connected to another access line (e.g., word line 110-a as illustrated with reference to FIG. 2). Alternatively, the programming pulse may be applied to the chalcogenide alloy 510 using a current flowing from the first electrode 505 electrically connected to an access line (e.g., bit line 115-a as illustrated with reference to FIG. 2) to the second electrode 515 electrically connected to another access line (e.g., word line 110-a as illustrated with reference to FIG. 2) or vice versa.

The polarity of the programming pulse may determine which of the two electrodes takes a higher electric potential level with respect to the other electrode and may not be limiting to the present disclosure one way or the other. The polarity of the programming pulse may be determined when the self-selecting memory device is designed so as to be compatible with other design factors and components of the device, e.g., periphery circuitry that produces various shapes of pulses. In some embodiments, a read pulse may be applied to the chalcogenide alloy 510 in a similar manner as the programming pulse by selecting a combination of access lines (e.g., bit line 115-a and word line 110-a as illustrated with reference to FIG. 2) electrically connected to the electrodes 505 and 515. In some embodiments, the read pulse may also have a single polarity. In some embodiments, the read pulse may have a same polarity as the programming pulse. In some embodiments, the read pulse may have a different polarity than the programming pulse. In some embodiments, periphery circuit design may be relatively simple when a same polarity is used between the programming pulse and the read pulse.

When a programming pulse is applied to the chalcogenide alloy 510, an electric field may be established across the chalcogenide alloy 510 due to the electrical potential difference between the first electrode 505 and the second electrode 515, and a current may flow through the chalcogenide alloy 510. Under the influence of the electric field, a constituent (which may also be referred to as an element or a part), which may take a form of ion, of the chalcogenide alloy 510 may migrate toward either the first electrode 505 or the second electrode 515. In some embodiments, selenium ions (e.g., selenium atoms with a negative net charge) in a SiSAG-based chalcogenide alloy may migrate toward an electrode exhibiting a positive potential with respect to the other electrode. Concurrently, a current flowing through the chalcogenide alloy 510 may heat the chalcogenide alloy 510 due to a resistance the chalcogenide alloy 510 and the electrodes may exhibit. Such heating may assist or facilitate the ion movements in the chalcogenide alloy 510 that is under the electric field. In some examples, a programming pulse having a single polarity may be based on a starting state (e.g., SET state) of the self-selecting memory cell featuring a starting composition profile. In some examples, a self-selecting memory cell may be reset or erased (e.g., using a RESET pulse) between operations. In such examples, the programming pulse may be based on the reset state of the self-selecting memory cell.

As a result, a non-uniform, asymmetric profile of spatial distribution of a constituent (e.g., selenium) within the chalcogenide alloy 510 (e.g., SiSAG-based chalcogenide alloy) may develop in response to applying the programming pulse to the chalcogenide alloy 510. Furthermore, various shapes of the programming pulse, as illustrated with reference to FIG. 4, may produce various profiles of spatial distributions of the constituent by modifying a magnitude of the electric field and an intensity of heating. Such non-uniform, asymmetric spatial distribution may result in local variations of composition of the chalcogenide alloy 510. In some embodiments, such local variations of composition of the chalcogenide alloy 510 may result in local variations in resistivity of the chalcogenide alloy 510.

Also illustrated in FIG. 5 are four different states of the chalcogenide alloy 510 represented by diagrams 501-a, 501-b, 501-c, and 501-d. For example, a non-uniform shading of the chalcogenide alloy 510-a may represent a non-uniform spatial distribution of a constituent (e.g., selenium in SiSAG-based alloy) of the chalcogenide alloy 510, established in response to applying a programming pulse. In other words, a darker shaded region may indicate a portion of the chalcogenide alloy 510 having a higher concentration of a constituent (e.g., selenium in SiSAG-based alloy) when compared to a lighter shaded region. Correspondingly, concentration profiles 520-a, 520-b, 520-c, and 520-d may represent non-uniform spatial distributions of a constituent (e.g., selenium) of the chalcogenide alloy 510 as a function of distance between the first electrode 505 and the second electrode 515. The concentration profiles may be linear or non-linear as illustrated in FIG. 5. It should be appreciated that the shadings and the profiles may be reversed (e.g., the diagram 501-a when compared to the diagram 501-c or the profile 520-b when compared to the profile 520-d) depending on the polarity of the programming pulse applied. It should also be appreciated that additional concentration profiles (not shown in FIG. 5) may be obtained by applying programming pulses with different shapes as described with reference to FIG. 4. The additional concentration profiles may have an intermediate level of concentration gradient or a more abrupt concentration profile than the concentration profiles illustrated in FIG. 5. As such, the present disclosure is not limited to the illustrative examples depicted in FIG. 5 with four different concentration profiles.

Each diagram 501-a, 501-b, 501-c, or 501-d may be associated with a particular programming pulse applied to the chalcogenide alloy 510. For example, the diagram 501-a may represent a state of the chalcogenide alloy 510 in terms of a profile of selenium concentration after the pulse 410 with the voltage amplitude $V_1$ is applied. In addition, the diagram 501-d may represent a state of the chalcogenide alloy 510 in terms of a profile of selenium concentration after the pulse 410 with the voltage amplitude $V_2$ is applied. The diagrams 501-b or 501-c may represent a state of the chalcogenide alloy 510 in terms of profiles of selenium concentration after another pulse 410 with a voltage amplitude between $V_1$ and $V_2$. Other forms of programming pulse, e.g., the pulse 420 or the pulse 440 as illustrated in FIG. 4 may be used in combination with variations in overall voltage (or current) amplitudes to target for a particular non-uniform concentration profile of a constituent of the chalcogenide alloy 510 (e.g., selenium) or a particular local composition variations, or a particular local resistivity variations within the chalcogenide alloy 510, which in turn may produce a particular threshold voltage of the self-selecting memory cell.

A particular non-uniform, asymmetric concentration profile of a constituent of the chalcogenide alloy 510 (e.g., selenium) may correspond to a particular threshold voltage of the self-selecting memory device including the chalcogenide alloy 510 when a read pulse is applied. As explained above, a memory cell (e.g., self-selecting memory cell) including an amorphous chalcogenide alloy may have a threshold voltage associated with it—that is, an appreciable amount of current may flow after the applied read voltage exceeds the threshold voltage. Thus, if the applied read voltage is less than the threshold voltage of the self-selecting memory cell, no appreciable amount of current may flow. In some embodiments, the current flow or lack thereof, may be sensed by the sense component 125 as described with reference to FIG. 1 to read stored information in the selected self-selecting memory cell.

Figure 6:
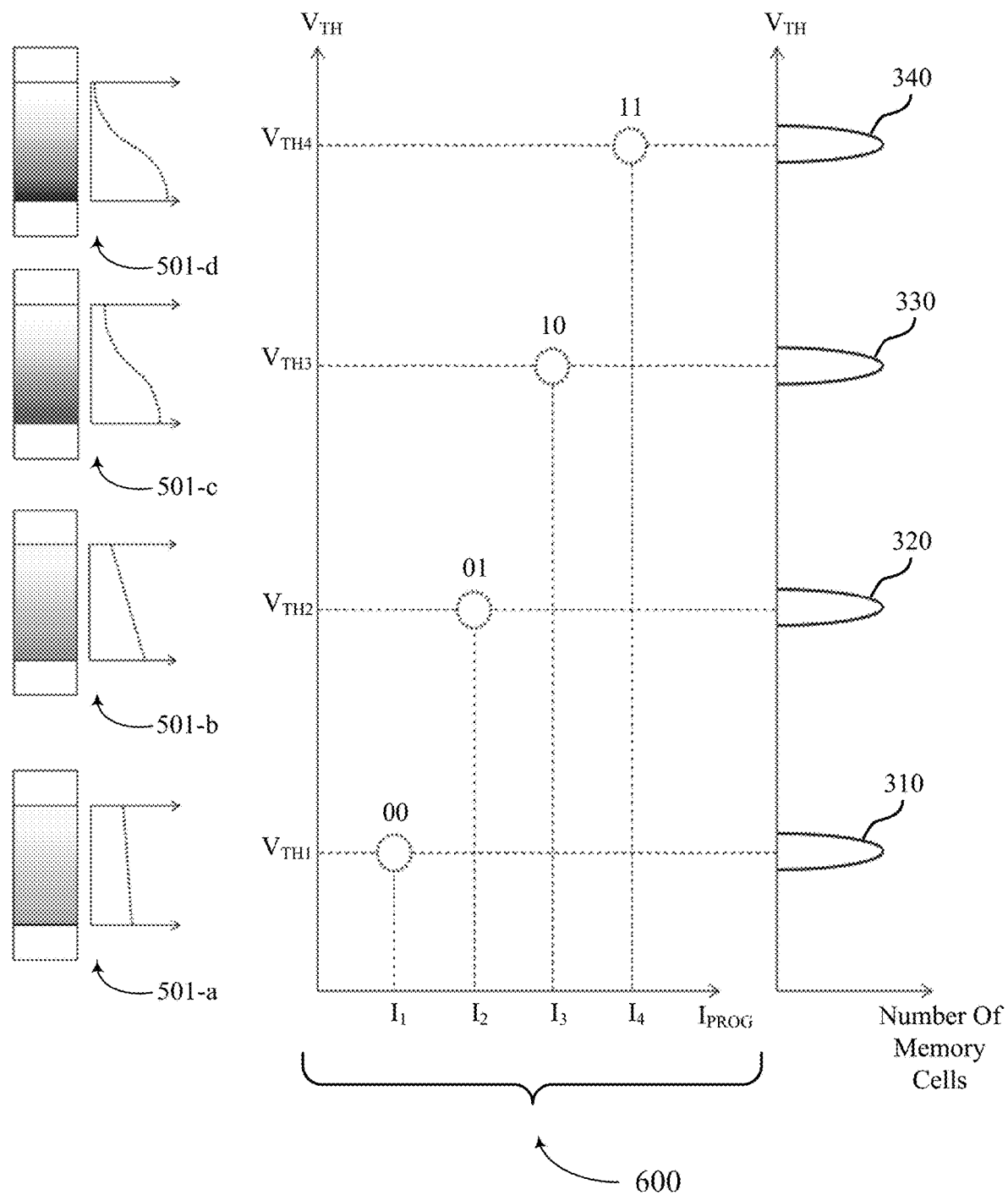
FIG. 6 illustrates an example of a threshold voltage versus a programming current ($V_{TH}$-$I_{PROG}$) plot that supports techniques to access a self-selecting memory device in accordance with embodiments of the present disclosure.

The threshold behavior may depend on a local concentration of a certain constituent (e.g., selenium), or a local composition, or a local resistivity of the chalcogenide alloy 510. In some embodiments, a particular threshold voltage of a self-selecting memory device may be determined based on a concentration of a constituent of the chalcogenide alloy 510 at or near the first electrode 505 or the second electrode 515. Therefore, the four different states of the chalcogenide alloy 510 represented by the diagrams 501-a, 501-b, 501-c, and 501-d in terms of concentration profiles of a constituent of the chalcogenide alloy 510 (e.g., selenium) may represent four particular threshold voltages of the self-selecting memory device (e.g., $V_{TH1}$, $V_{TH2}$, $V_{TH3}$, and $V_{TH4}$, as illustrated in FIG. 6), hence representing a multi-level cell configuration that stores two bits per cell. Each of the states of the chalcogenide alloy 510 represented by the diagram 501-a, 501-b, 501-c, or 501-d may represent one of four different logical states of 00, 01, 10, and 11. In some embodiments, a threshold voltage of the self-selecting memory device may be proportional to a local concentration of a constituent of the chalcogenide alloy 510 established at or near an interface between the chalcogenide alloy 510 and the electrodes. As a way of example, $V_{TH4}$ may be greater than $V_{TH1}$ as a result of a higher concentration of a constituent of the chalcogenide alloy 510 (e.g., selenium) established at the interface between the chalcogenide alloy 510 and the second electrode 515.

When a memory controller determines a shape of a programming pulse in order to obtain a particular threshold voltage of a self-selecting memory cell, the memory controller may determine the shape of the programming pulse based on a present state of the self-selecting memory cell and the desired particular threshold voltage of the self-selecting memory cell. For example, the rectangular pulse 410 with $V_1$ may suffice for a self-selecting memory cell to produce $V_{TH4}$ if the self-selecting memory cell presently exhibits a threshold voltage of $V_{TH3}$. The rectangular pulse 410 with $V_2$ may be used, however, for the same self-selecting memory cell to produce $V_{TH4}$ if the self-selecting memory cell presently exhibits a threshold voltage of $V_{TH1}$. Alternatively, different shapes of the pulse 440 may be determined for different cases where a logic state of a self-selecting memory cell changing from a logic state 00 (e.g., $V_{TH1}$) to a logic state 11 (e.g., $V_{TH4}$) or from a logic state 10 (e.g., $V_{TH3}$) to the logic state 11 (e.g., $V_{TH4}$).

FIG. 6 illustrates an example of a threshold voltage versus a programming current ($V_{TH}$-$I_{PROG}$) plot 600 that supports techniques to access a self-selecting memory device in accordance with various embodiments of the present disclosure. The self-selecting memory device may include a chalcogenide alloy 510 that may be a part of the composite stack including a first electrode 505 and a second electrode 515 as illustrated with reference to FIG. 5 or a first electrode 215-a and a second electrode 225-a as illustrated with reference to FIG. 2. In the $V_{TH}$-$I_{PROG}$ plot 600, threshold voltages of a self-selecting memory device is represented in a vertical axis (i.e., y-axis) as a function of a current associated with a programming pulse in a horizontal axis (i.e., x-axis). In FIG. 6, the four different states of the chalcogenide alloy 510 represented by the diagrams 501-a, 501-b, 501-c, and 501-d as well as the threshold voltage distributions 300 are juxtaposed. The $V_{TH}$-$I_{PROG}$ plot 600 may represent four logic states of a self-selecting memory device that stores two bits per cell as represented by four distinguishable threshold voltage distributions, each corresponding to one logic states of 00, 01, 10, or 11. Variations around a median $V_{TH}$ of a particular logic state (e.g., $V_{TH1}$ of the logic state of 00) may represent fluctuations in threshold voltages due to fluctuations in actual programming currents and resulting $V_{TH}$ values.

An increase in a programming current, $I_{PROG}$, may correspond to an increase in a threshold voltage of the self-selecting memory cell. For example, when a programming pulse (e.g., a programming pulse causing a current Ii flowing through the chalcogenide alloy 510) is applied to the self-selecting memory cell, the self-selecting memory cell may exhibit a threshold voltage corresponding to $V_{TH1}$. When a programming pulse (e.g., a programming pulse causing a current $I_3$ flowing through the chalcogenide alloy 510) is applied to the self-selecting memory device, the self-selecting memory device may exhibit a threshold voltage corresponding to $V_{TH3}$. Such increase in threshold voltage may be attributable to different concentration profiles of a constituent (e.g., selenium in SiSAG-based chalcogenide alloy) at or near electrodes between diagrams 501-a and 501-c, as illustrated with reference to FIG. 5, hence different local compositions of the chalcogenide alloy or different local resistivity of the chalcogenide alloy established by increased programming current, $I_{PROG}$.

A threshold voltage of the self-selecting memory cell may be proportional to a local concentration of a constituent of the chalcogenide alloy established at or near an interface between the chalcogenide alloy and the electrodes. As a way of example, $V_{TH4}$ may be greater than $V_{TH1}$ as a result of a higher concentration of a constituent of the chalcogenide alloy 510 (e.g., selenium) established at the interface between the chalcogenide alloy 510 and the second electrode 515 in response to a programming pulse. Other constituents of the chalcogenide alloy 510 (e.g., silicon, germanium, arsenic, or a combination thereof in SiSAG-based chalcogenide alloy) may behave differently under the programming pulse and exhibit a different concentration profile (e.g., a flipped concentration profile having a lower concentration at the interface between the chalcogenide alloy 510 and the second electrode 515).

A programming pulse with an opposite polarity may be applied to a self-selecting memory cell in some embodiments to reduce a threshold voltage of the self-selecting memory cell. The reduction in the threshold voltage of the self-selecting memory cell may be attributed to a decrease in a concentration of a constituent of the chalcogenide alloy 510 (e.g., selenium) in response to the programming pulse with the opposite polarity. In some embodiments, a programming pulse with a less amplitude (e.g., $V_1$ of pulse 410) may reduce a threshold voltage of a self-selecting memory cell that has been programmed to have a greater threshold voltage in response to a programming pulse with a greater amplitude (e.g., $V_2$ of pulse 410).

As discussed above, shapes of a programming pulse with a single polarity may be modified to produce different strengths in the electric field across the chalcogenide alloy, different levels of $I_{PROG}$, and different heating intensities to alter a spatial distribution of a constituent (e.g., selenium) of the chalcogenide alloy 510. Hence, the shapes of a programming pulse may be modified to accomplish a certain threshold voltage in a self-selecting memory cell. In some embodiments, a multi-level cell programming (e.g., programming a self-selecting memory cell to have four different logical states described with reference to FIG. 6) may be achieved using programming pulses described with reference to FIG. 4 (e.g., pulse 410). The multi-level cell programming may start with a self-selecting memory cell having a substantially uniform concentration profile of a constituent (e.g., concentration profile 520). When amplitudes of the programming pulse increases (e.g., $V_2$ versus $V_1$ of pulse 410), the concentration profile may develop a greater concentration gradient (e.g., concentration profile 520-b when compared to concentration profile 520-a or 520) establishing a higher concentration at the interface between the chalcogenide alloy 510 and the second electrode 515. The higher concentration at the interface may accomplish a greater threshold voltage. Thus, the multi-level cell programming may be achieved by gradually increasing a concentration of a constituent of the chalcogenide alloy at the interface by gradually increasing amplitudes of the programming pulses. It should be appreciated that the example of FIG. 6 illustrates a multi-level cell programming scheme storing two bits per cell with four different logical states, however the present disclosure may not be limited to two bits per cell.

Figure 7:
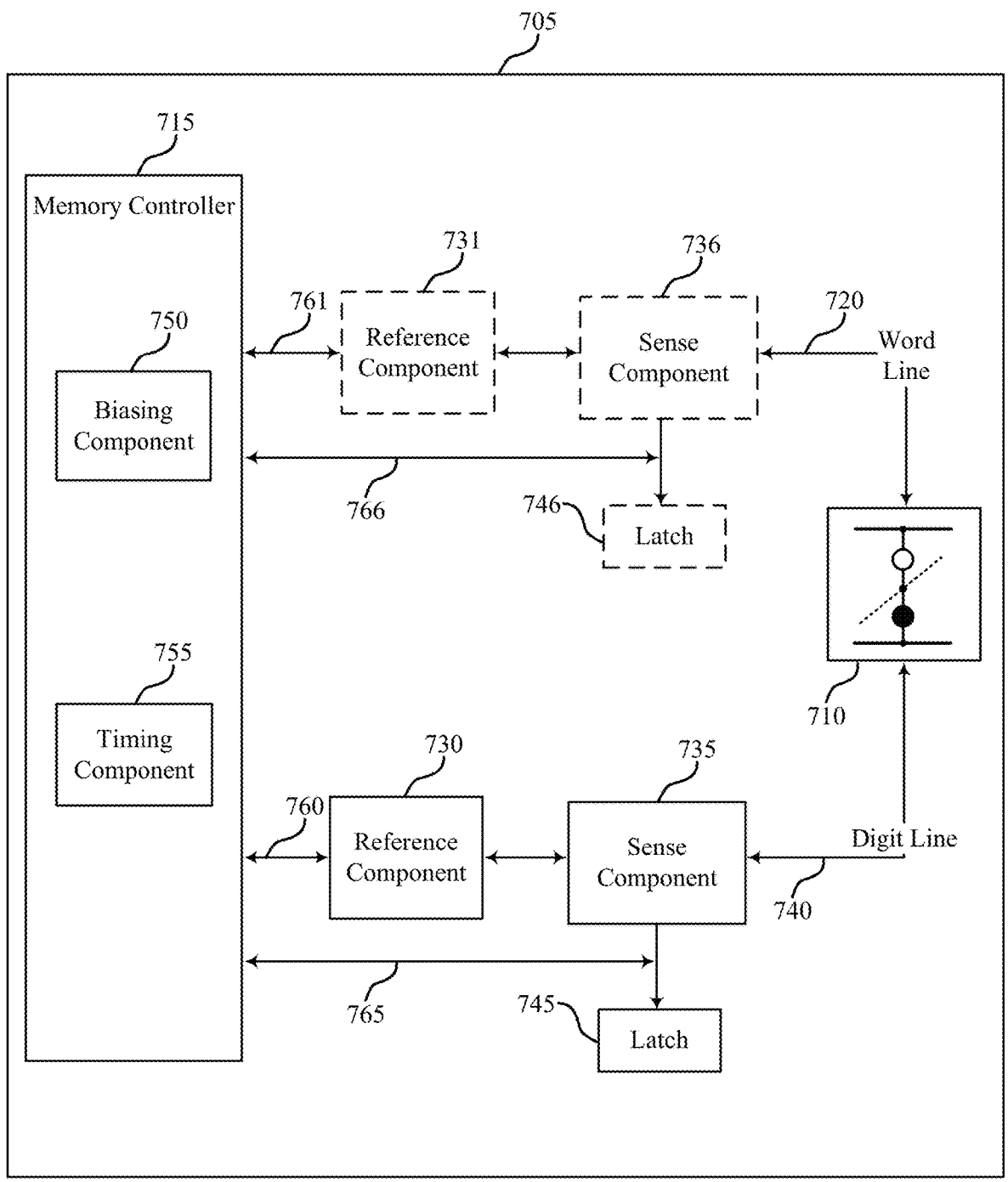
FIGS. 7 and 8 show block diagrams of a device that supports techniques to access a self-selecting memory device in accordance with embodiments of the present disclosure.

FIG. 7 shows a block diagram 700 of a memory array 705 that supports techniques to access a self-selecting memory device in accordance with embodiments of the present disclosure. The memory array 705 may be referred to as an electronic memory apparatus, and may be an example of a component of a memory device 100 as described herein.

The memory array 705 may include one or more memory cells 710, a memory controller 715, a word line 720, a reference component 730, a sense component 735, a digit line 740, and a latch 745. These components may be in electronic communication with each other and may perform one or more of the functions described herein. In some cases the memory cells 710 may include self-selecting memory cells. In some cases, the memory controller 715 may include a biasing component 750 and a timing component 755. In some cases, a sense component 735 may serve as the reference component 730. In other cases, the reference component 730 may be optional. Also, FIG. 7 shows an alternative schematic option of arranging a sense component 736, a latch 746, and a reference component 731 (in dashed boxes). An ordinary person skilled in the art would appreciate that the sense component and the associated components (i.e., the latch and the reference component) may be associated either with a column decoder or a row decoder without losing their functional purposes.

The memory controller 715 may be in electronic communication with the word line 720, the digit line 740, and the sense component 735, which may be examples of the word line 110, the digit line 115, and the sense component 125 described with reference to FIGS. 1 and 2. The components of the memory array 705 may be in electronic communication with each other and may perform aspects of the functions described with reference to FIGS. 1 through 6. In some cases, the reference component 730, the sense component 735, and the latch 745 may be components of the memory controller 715.

In some embodiments, the digit line 740 is in electronic communication with the sense component 735 and a self-selecting memory cell 710. The self-selecting memory cell 710 may be writable with a logic state (e.g., a first, second, or third logic state). The word line 720 may be in electronic communication with the memory controller 715 and the self-selecting memory cell 710. The sense component 735 may be in electronic communication with the memory controller 715, the digit line 740, the latch 745, and the reference line 760. The reference component 730 may be in electronic communication with the memory controller 715 and the reference line 760. A sense control line 765 may be in electronic communication with the sense component 735 and the memory controller 715. These components may also be in electronic communication with other components, both inside and outside of the memory array 705, in addition to components not listed above, via other components, connections, or buses.

The memory controller 715 may be configured to activate the word line 720 or the digit line 740 by applying voltages to those various nodes. For example, the biasing component 750 may be configured to apply a voltage to operate the self-selecting memory cell 710 to read or write the self-selecting memory cell 710 as described above. In some cases, the memory controller 715 may include a row decoder, a column decoder, or both, as described herein. This may enable the memory controller 715 to access one or more self-selecting memory cells 105 as illustrated with reference to FIG. 1. The biasing component 750 may also provide voltage to the reference component 730 in order to generate a reference signal for the sense component 735. Additionally, the biasing component 750 may provide voltages for the operation of the sense component 735.

In some embodiments, the memory controller 715 may perform its operations using the timing component 755. For example, the timing component 755 may control the timing of the various word line selections or bit line biasing, including timing for switching and voltage application to perform the memory functions, such as reading and writing, discussed herein. In some cases, the timing component 755 may control the operations of the biasing component 750.

The reference component 730 may include various components to generate a reference signal for the sense component 735. The reference component 730 may include circuitry configured to produce a reference signal. In some cases, the reference component 730 may be implemented using other self-selecting memory cells 105. The sense component 735 may compare a signal from the self-selecting memory cell 710 (through the digit line 740) with a reference signal from the reference component 730. Upon determining the logic state, the sense component may then store the output in the latch 745, where it may be used in accordance with the operations of an electronic device that the memory array 705 is a part. The sense component 735 may include a sense amplifier in electronic communication with the latch 745 and the self-selecting memory cell 710.

The memory controller 715 and/or at least some of its various sub-components may be implemented in hardware, software executed by a processor, firmware, or any combination thereof. If implemented in software executed by a processor, the functions of the memory controller 715 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The memory controller 715 and/or at least some of its various sub-components may be physically located at various positions, including being distributed such that portions of functions are implemented at different physical locations by one or more physical devices. In some embodiments, the memory controller 715 and/or at least some of its various sub-components may be a separate and distinct component in accordance with various embodiments of the present disclosure. In other examples, the memory controller 715 and/or at least some of its various sub-components may be combined with one or more other hardware components, including but not limited to an I/O component, a transceiver, a network server, another computing device, one or more other components described in the present disclosure, or a combination thereof in accordance with various embodiments of the present disclosure.

The memory controller 715 may determine a desired logic state of a self-selecting memory cell, the desired logic state representing one or more bits of data, determine a threshold voltage of the self-selecting memory cell that corresponds to the desired logic state of the self-selecting memory cell, determine a shape of a programming pulse having a single polarity in order to obtain the threshold voltage of the self-selecting memory cell, and apply the programming pulse to the self-selecting memory cell based on determining the shape of the programming pulse. The memory controller 715 may also determine a desired threshold voltage of a self-selecting memory cell that includes a chalcogenide alloy, the desired threshold voltage corresponding to a logic state of the self-selecting memory cell representing one or more bits of data, determine a shape of a programming pulse having a single polarity producing a current flowing through the self-selecting memory cell in order to obtain the desired threshold voltage of the self-selecting memory cell, and apply the programming pulse to the self-selecting memory cell based on determining the shape of the programming pulse to alter a spatial distribution of at least one part of the chalcogenide alloy along a direction of the current, where the desired threshold voltage of the self-selecting memory cell is based at last in part on the spatial distribution of the at least one part of the chalcogenide alloy.

Figure 8:
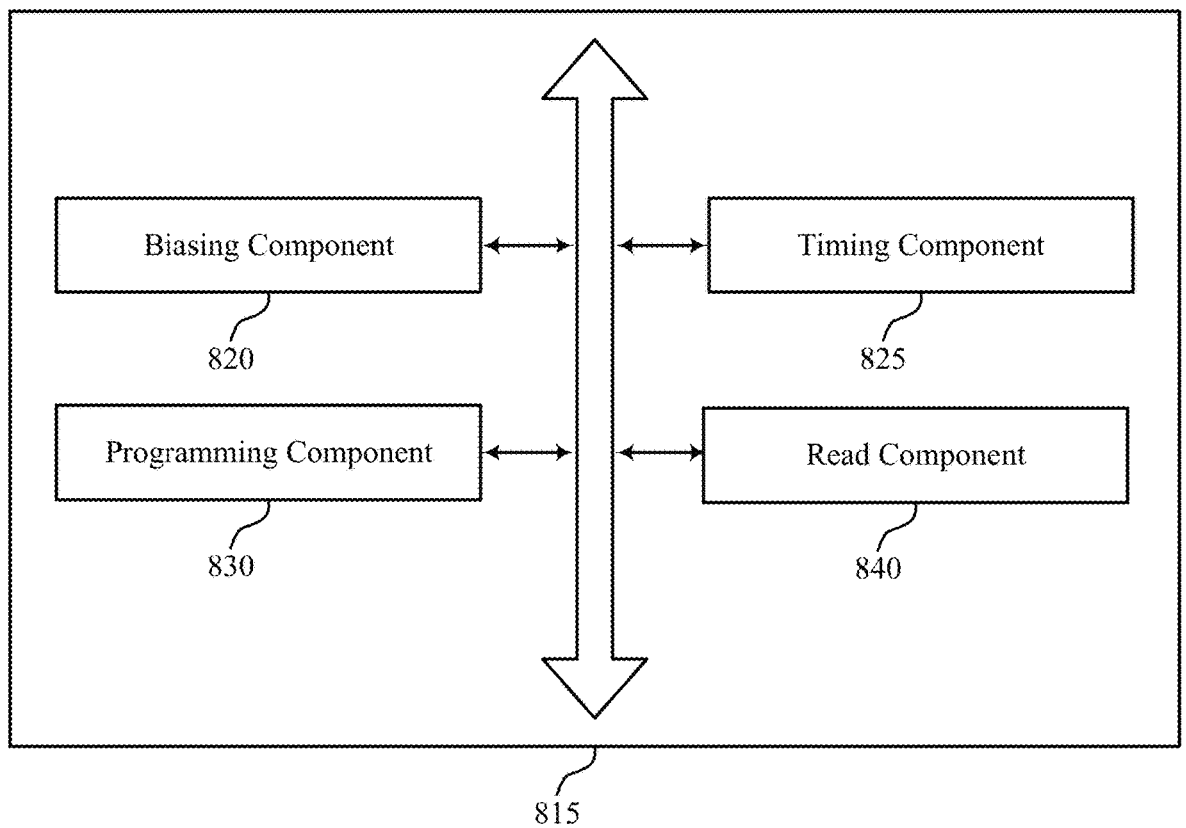

FIG. 8 shows a block diagram 800 of a memory controller 815 that supports techniques to access a self-selecting memory device in accordance with embodiments of the present disclosure. The memory controller 815 may be an example of aspects of a memory controller 715 and 915 described with reference to FIGS. 7 and 9. The memory controller 815 may include a biasing component 820, a timing component 825, a programming component 830, and a read component 840. Each of these modules may communicate, directly or indirectly, with one another (e.g., via one or more buses).

In some embodiments, the biasing component 820 may apply the programming pulse to the self-selecting memory cell based on determining the shape of the programming pulse, vary a current level flowing through the self-selecting memory cell to cause variations of the shape of the programming pulse when the programming pulse is applied to the self-selecting memory cell, heat the chalcogenide alloy as a result of producing the current flowing through the chalcogenide alloy, or initiate a net movement of the at least one constituent of the chalcogenide alloy between the first side of the chalcogenide alloy and the second side of the chalcogenide alloy based on heating the chalcogenide alloy.

In some embodiments, the biasing component 820 may apply one or more read pulses having a single polarity, apply the programming pulse to the self-selecting memory cell based on determining the shape of the programming pulse to alter a spatial distribution of at least one part of the chalcogenide alloy along a direction of the current, where the desired threshold voltage of the self-selecting memory cell is based at last in part on the spatial distribution of the at least one part of the chalcogenide alloy, or heat the chalcogenide alloy based on the current flowing through the self-selecting memory cell to assist the net movements of the at least one part of the chalcogenide alloy.

In some embodiments, the biasing component 820 may apply one or more read pulses having the same polarity as the programming pulse or a different polarity than the programming pulse. In some cases, applying the programming pulse to the self-selecting memory cell may include producing a current flowing through the chalcogenide alloy and establishing an electric field across the chalcogenide alloy based on a fixed voltage amplitude to cause net movements of the at least one part of the chalcogenide alloy.

In some embodiments, the timing component 825 may determine one or more time durations during which a fixed voltage amplitude is maintained to produce the current flowing through the self-selecting memory cell during each time duration.

In some embodiments, the programming component 830 may determine a desired logic state of a self-selecting memory cell, the desired logic state representing one or more bits of data, determine a threshold voltage of the self-selecting memory cell that corresponds to the desired logic state of the self-selecting memory cell, determine a shape of a programming pulse having a single polarity in order to obtain the threshold voltage of the self-selecting memory cell, vary the shape of the programming pulse produces different profiles of the asymmetric spatial distribution of the at least one constituent of the chalcogenide alloy between the first side of the chalcogenide alloy and the second side of the chalcogenide alloy, and determine a desired threshold voltage of a self-selecting memory cell that includes a chalcogenide alloy, the desired threshold voltage corresponding to a logic state of the self-selecting memory cell representing one or more bits of data.

In some embodiments, the programming component 830 may determine a shape of a programming pulse having a single polarity producing a current flowing through the self-selecting memory cell in order to obtain the desired threshold voltage of the self-selecting memory cell, set the desired threshold voltage of the self-selecting memory cell based on a concentration of the at least one part of the chalcogenide alloy at either the first interface or the second interface.

In some embodiments, the read component 840 may detect the threshold voltage of the self-selecting memory cell based on applying the one or more read pulses, determine the logic state of the self-selecting memory cell based on detecting the threshold voltage of the self-selecting memory cell, and determine the logic state of the self-selecting memory cell based on applying the one or more read pulses that detect the threshold voltage of the self-selecting memory cell.

Figure 9:
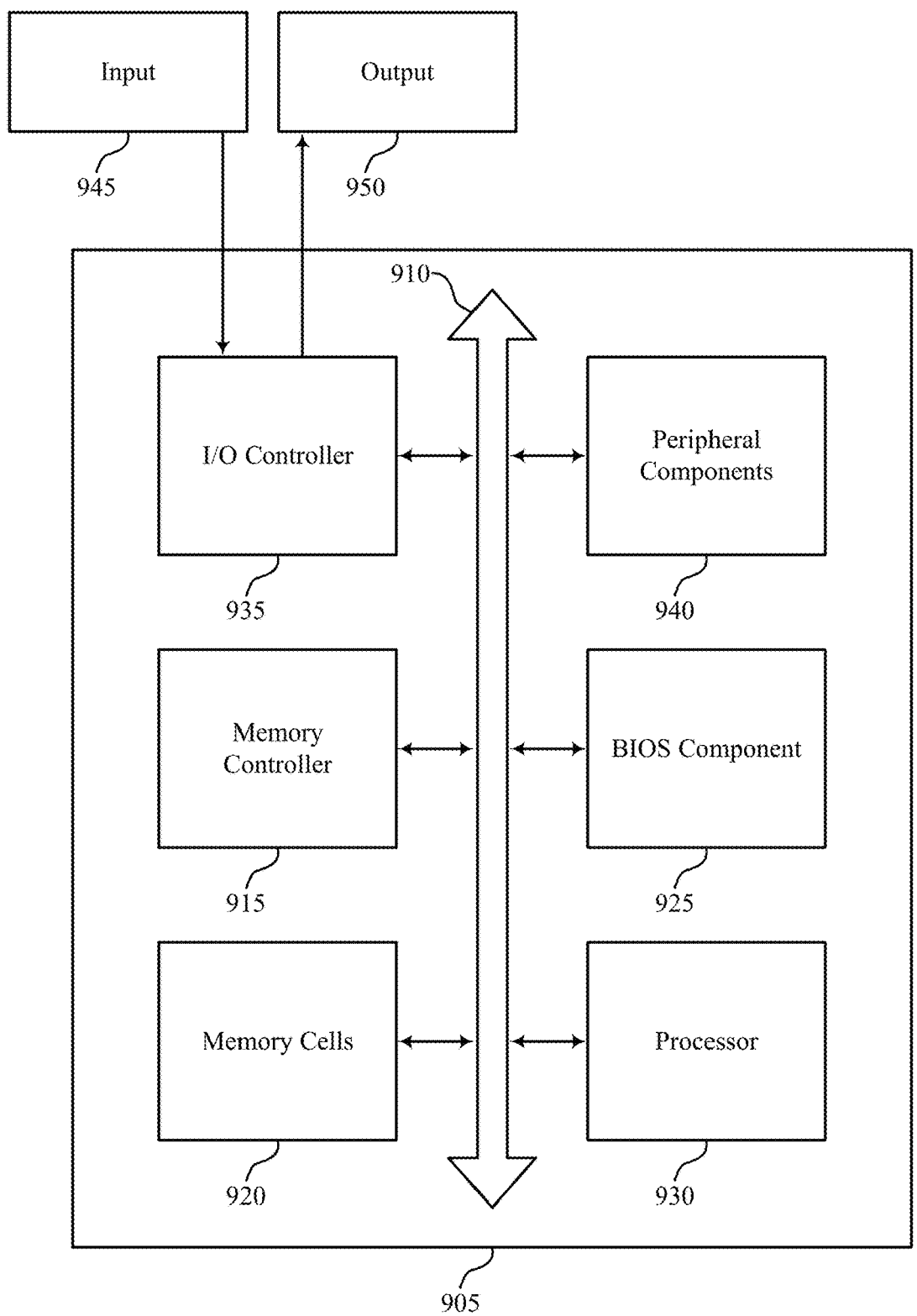
FIG. 9 illustrates a block diagram of a system including a memory array that supports techniques to access a self-selecting memory device in accordance with embodiments of the present disclosure.

FIG. 9 shows a diagram of a system 900 including a device 905 that supports techniques to access a self-selecting memory device in accordance with embodiments of the present disclosure. The device 905 may be an example of or include the components of memory device 100 as described above, e.g., with reference to FIG. 1. The device 905 may include components for bi-directional voice and data communications including components for transmitting and receiving communications, including a memory controller 915, memory cells 920, a basic input/output system (BIOS) component 925, a processor 930, an I/O controller 935, and a peripheral components 940. These components may be in electronic communication via one or more buses (e.g., bus 910).

The memory cells 920 may store information (i.e., in the form of a logical state) as described herein. In some embodiments, the memory cells 920 may include a cross-point memory array comprising self-selecting memory cells. The memory controller 915 may be coupled with the cross-point array and operable to perform access operations (e.g., programming or read) as described above with reference to FIG. 8. In some embodiments, the memory controller 915 may include a periphery circuit that produces the polarity of the read pulse and the polarity of the programming pulse that may be different than the polarity of the read pulse. In some embodiments, the cross-point memory array includes two or more decks of self-selecting memory cells each comprising a chalcogenide alloy, a first side of the chalcogenide alloy interfacing with a first electrode and a second side of the chalcogenide alloy interfacing with a second electrode.

The BIOS component 925 be a software component that includes BIOS operated as firmware, which may initialize and run various hardware components. The BIOS component 925 may also manage data flow between a processor and various other components, e.g., peripheral components, input/output control component, etc. The BIOS component 925 may include a program or software stored in read only memory (ROM), flash memory, or any other non-volatile memory.

The processor 930 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, the processor 930 may be configured to operate a memory array using a memory controller. In other cases, a memory controller may be integrated into the processor 930. The processor 930 may be configured to execute computer-readable instructions stored in a memory to perform various functions (e.g., functions or tasks supporting techniques to access a self-selecting memory device).

The I/O controller 935 may manage input and output signals for the device 905. The I/O controller 935 may also manage peripherals not integrated into the device 905. In some cases, the I/O controller 935 may represent a physical connection or port to an external peripheral. In some cases, the I/O controller 935 may utilize an operating system such as iOS®, ANDROID®, MS-DOS®, MS-WINDOWS®, OS/2®, UNIX®, LINUX®, or another known operating system. In other cases, the I/O controller 935 may represent or interact with a modem, a keyboard, a mouse, a touchscreen, or a similar device. In some cases, the I/O controller 935 may be implemented as part of a processor. In some cases, a user may interact with the device 905 via the I/O controller 935 or via hardware components controlled by the I/O controller 935.

The peripheral components 940 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

The input device 945 may represent a device or signal external to the device 905 that provides input to the device 905 or its components. This may include a user interface or an interface with or between other devices. In some cases, the input 945 may be managed by the I/O controller 935, and may interact with the device 905 via the peripheral component 940.

The output device 950 may also represent a device or signal external to the device 905 configured to receive output from the device 905 or any of its components. Examples of the output 950 may include a display, audio speakers, a printing device, another processor or printed circuit board, etc. In some cases, the output 950 may be a peripheral element that interfaces with the device 905 via the peripheral component(s) 940. In some cases, the output 950 may be managed by the I/O controller 935.

The components of the device 905 may include circuitry designed to carry out their functions. This may include various circuit elements, for example, conductive lines, transistors, capacitors, inductors, resistors, amplifiers, or other active or inactive elements, configured to carry out the functions described herein. The device 905 may be a computer, a server, a laptop computer, a notebook computer, a tablet computer, a mobile phone, a wearable electronic device, a personal electronic device, or the like. Or the device 905 may be a portion or aspect of such a device.

Figure 10:
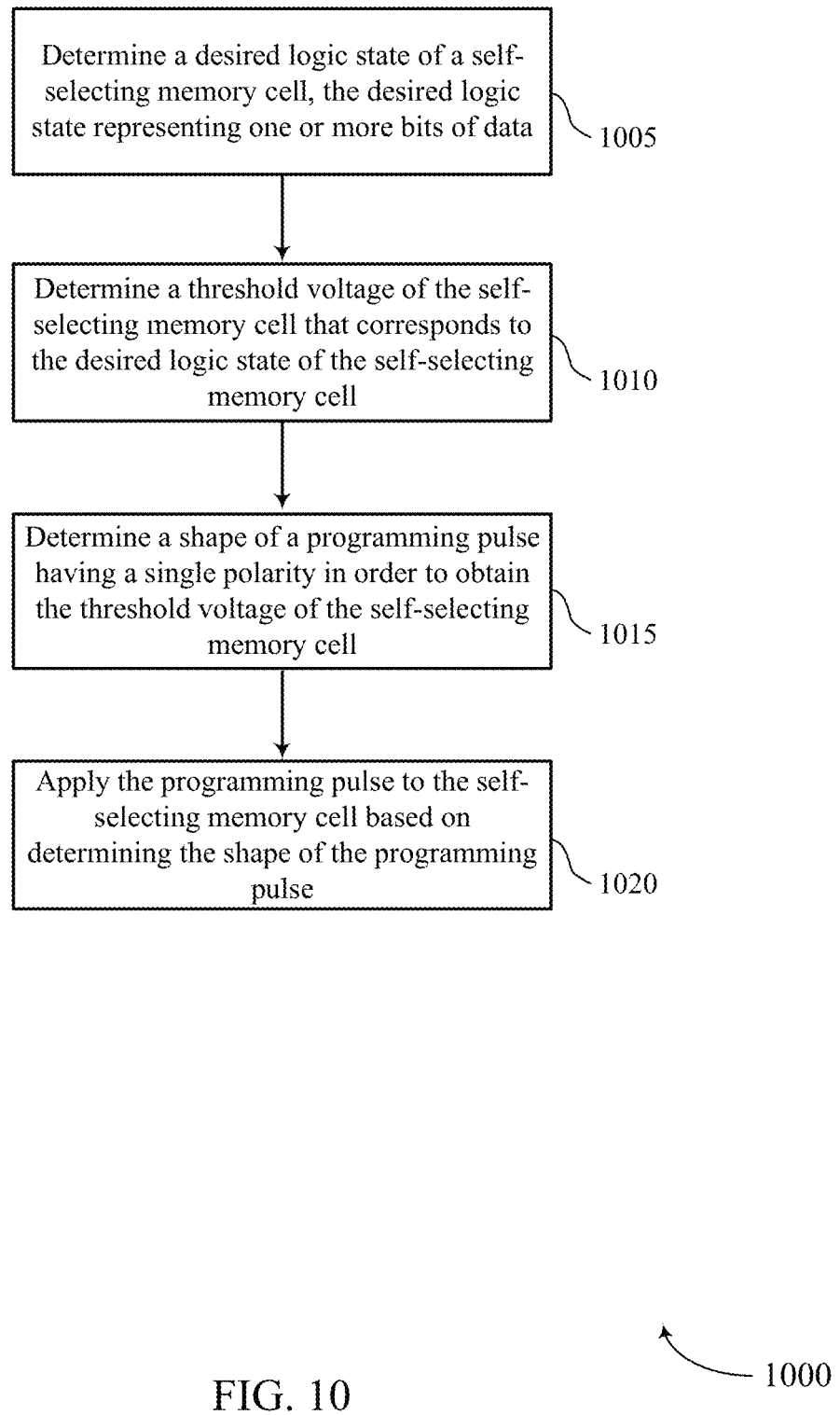
FIGS. 10 through 12 illustrate methods for techniques to access a self-selecting memory device in accordance with embodiments of the present disclosure.

FIG. 10 shows a flowchart illustrating a method 1000 for accessing a self-selecting memory device in accordance with embodiments of the present disclosure. The operations of method 1000 may be implemented by a memory device 100 or its components as described herein. For example, the operations of method 1000 may be performed by a memory controller as described with reference to FIGS. 1 and 7 through 9. In some embodiments, the memory device 100 may execute a set of codes to control the functional elements of the device to perform the functions described below. Additionally or alternatively, the memory device 100 may perform aspects of the functions described below using special-purpose hardware.

At block 1005 the memory device 100 may determine a desired logic state of a self-selecting memory cell, the desired logic state representing one or more bits of data. The operations of block 1005 may be performed according to the methods described herein. In certain examples, aspects of the operations of block 1005 may be performed by a programming component as described with reference to FIGS. 7 through 9.

At block 1010 the memory device 100 may determine a threshold voltage of the self-selecting memory cell that corresponds to the desired logic state of the self-selecting memory cell. The operations of block 1010 may be performed according to the methods described herein. In certain examples, aspects of the operations of block 1010 may be performed by a programming component as described with reference to FIGS. 7 through 9.

At block 1015 the memory device 100 may determine a shape of a programming pulse having a single polarity in order to obtain the threshold voltage of the self-selecting memory cell. The operations of block 1015 may be performed according to the methods described herein. In certain examples, aspects of the operations of block 1015 may be performed by a programming component as described with reference to FIGS. 7 through 9.

At block 1020 the memory device 100 may apply the programming pulse to the self-selecting memory cell based at least in part on determining the shape of the programming pulse. The operations of block 1020 may be performed according to the methods described herein. In certain examples, aspects of the operations of block 1020 may be performed by a biasing component as described with reference to FIGS. 7 through 9.

In some cases, the method 1000 may also include determining a desired logic state of a self-selecting memory cell, the desired logic state representing one or more bits of data. In some cases, the polarity of the one or more read pulses is different from the polarity of the programming pulse. In some cases, the method 1000 may also include determining a shape of a programming pulse having a single polarity in order to obtain the threshold voltage of the self-selecting memory cell. In some cases, the method 1000 may also include applying the programming pulse to the self-selecting memory cell based at least in part on determining the shape of the programming pulse. In some cases, determining the shape of the programming pulse comprises: determining one or more time durations during which a fixed voltage amplitude is maintained. In some cases, the method 1000 may also include varying a current level flowing through the self-selecting memory cell to cause variations of the shape of the programming pulse when the programming pulse is applied to the self-selecting memory cell.

In some cases, the method 1000 may also include varying the shape of the programming pulse to produce different threshold voltages of the self-selecting memory cell. In some cases, the variations of the shape of the programming pulse comprise a second voltage level greater than a first voltage level or a second current level greater than a first current level based at least in part on that the second voltage level or the second current level establishes a greater threshold voltage of the self-selecting memory cell than the first voltage level or the first current level does. In some cases, the self-selecting memory cell includes a chalcogenide alloy wherein a first side of the chalcogenide alloy interfaces with a first electrode and a second side of the chalcogenide alloy interfaces with a second electrode. In some cases, the threshold voltage of the self-selecting memory cell is set based at least in part on a local composition of the chalcogenide alloy at the first side of the chalcogenide alloy or at the second side of the chalcogenide alloy. In some cases, the chalcogenide alloy includes: at least one of silicon (Si), selenium (Se), arsenic (As), or germanium (Ge). In some cases, applying the programming pulse to the self-selecting memory cell comprises: producing an asymmetric spatial distribution of at least one constituent of the chalcogenide alloy between the first side of the chalcogenide alloy and the second side of the chalcogenide alloy. In some cases, the method 1000 may also include determining a threshold voltage of the self-selecting memory cell that corresponds to the desired logic state of the self-selecting memory cell.

In some cases, the method 1000 may also include varying the shape of the programming pulse to produce different profiles of the asymmetric spatial distribution of the at least one constituent of the chalcogenide alloy between the first side of the chalcogenide alloy and the second side of the chalcogenide alloy. In some cases, applying the programming pulse to the self-selecting memory cell comprises: producing a current flowing through the chalcogenide alloy. In some cases, the method 1000 may also include heating the chalcogenide alloy based at least in part on producing the current flowing through the chalcogenide alloy. In some cases, the method 1000 may also include initiating a net movement of the at least one constituent of the chalcogenide alloy between the first side of the chalcogenide alloy and the second side of the chalcogenide alloy based at least in part on heating the chalcogenide alloy.

In some cases, the threshold voltage of the self-selecting memory cell is set by a concentration of the at least one constituent of the chalcogenide alloy at the first side of the chalcogenide alloy or at the second side of the chalcogenide alloy. In some cases, the threshold voltage of the self-selecting memory cell is proportional to a local concentration of the at least one constituent of the chalcogenide alloy at the first side of the chalcogenide alloy or at the second side of the chalcogenide alloy. In some cases, the self-selecting memory cell is a part of a three-dimensional cross-point memory array comprising one or more decks of memory array and each deck of memory array is placed either on top of a substrate or another deck of memory array. In some cases, the self-selecting memory cell is a part of a three-dimensional memory array comprising vertically-disposed first access lines crossing horizontally-disposed second access lines. In some cases, the method 1000 may also include applying one or more read pulses having a single polarity. In some cases, the method 1000 may also include detecting the threshold voltage of the self-selecting memory cell based at least in part on applying the one or more read pulses. In some cases, the method 1000 may also include determining the logic state of the self-selecting memory cell based at least in part on detecting the threshold voltage of the self-selecting memory cell. In some cases, the at least one constituent of the chalcogenide alloy producing the asymmetric spatial distribution is selenium (Se).

In some embodiments, an apparatus for accessing a self-selecting memory device is described. The apparatus may include means for determining a desired logic state of a self-selecting memory cell, the desired logic state representing one or more bits of data, means for determining a threshold voltage of the self-selecting memory cell that corresponds to the desired logic state of the self-selecting memory cell, means for determining a shape of a programming pulse having a single polarity in order to obtain the threshold voltage of the self-selecting memory cell, and means for applying the programming pulse to the self-selecting memory cell based at least in part on determining the shape of the programming pulse.

In some cases, the apparatus may further include means for varying a current level flowing through the self-selecting memory cell to cause variations of the shape of the programming pulse when the programming pulse is applied to the self-selecting memory cell. In some cases, the apparatus may further include means for varying the shape of the programming pulse to produce different profiles of the asymmetric spatial distribution of the at least one constituent of the chalcogenide alloy between the first side of the chalcogenide alloy and the second side of the chalcogenide alloy. In some cases, the apparatus may further include means for applying one or more read pulses having a single polarity, means for detecting the threshold voltage of the self-selecting memory cell based at least in part on applying the one or more read pulses, and means for determining the logic state of the self-selecting memory cell based at least in part on detecting the threshold voltage of the self-selecting memory cell.

Figure 11:
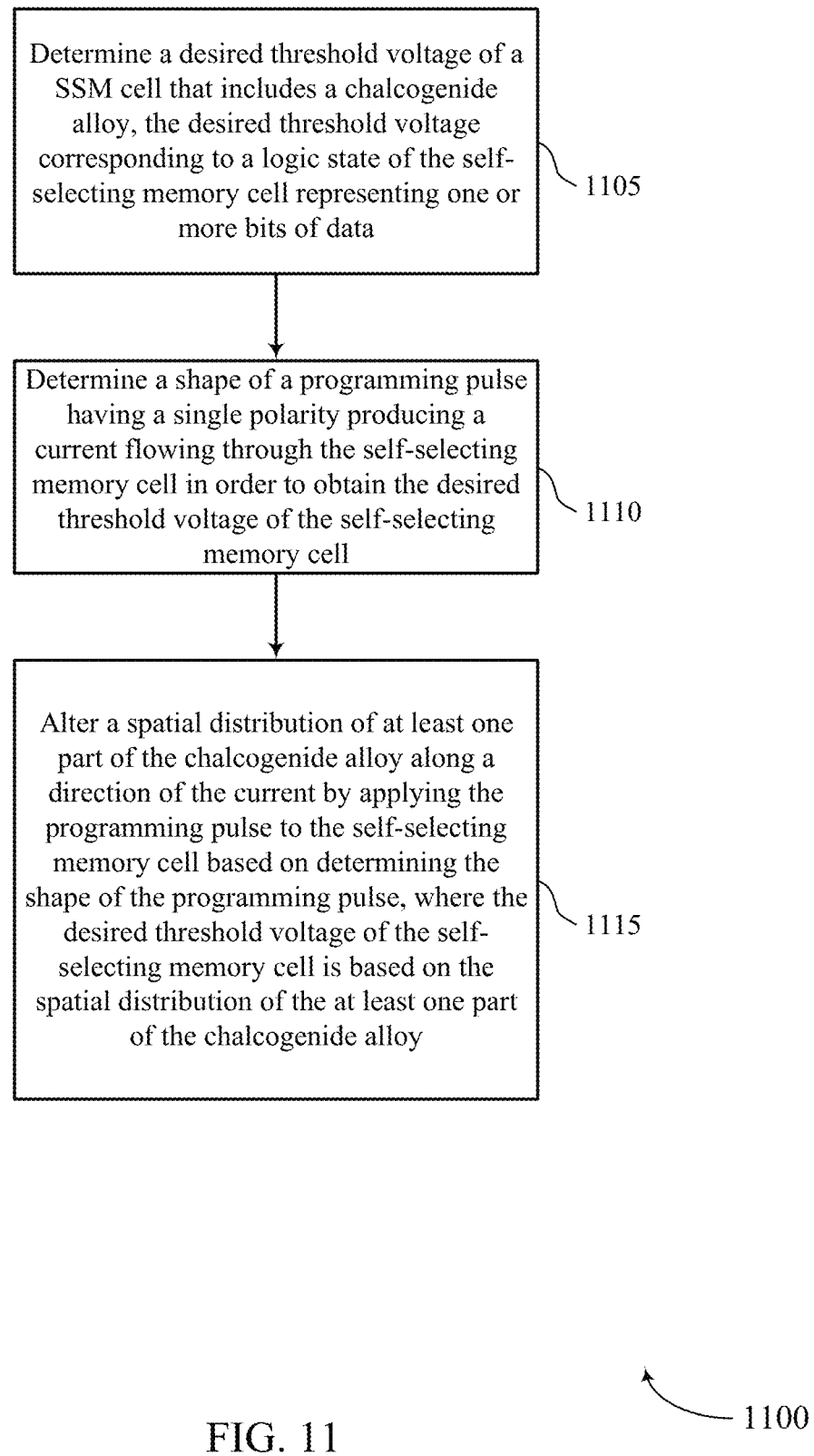

FIG. 11 shows a flowchart illustrating a method 1100 for accessing a self-selecting memory device in accordance with embodiments of the present disclosure. The operations of method 1100 may be implemented by a memory device 100 or its components as described herein. For example, the operations of method 1100 may be performed by a memory controller as described with reference to FIGS. 1 and 7 through 9. In some embodiments, the memory device 100 may execute a set of codes to control the functional elements of the device to perform the functions described below. Additionally or alternatively, the memory device 100 may perform aspects of the functions described below using special-purpose hardware.

At block 1105 the memory device 100 may determine a desired threshold voltage of a self-selecting memory cell that comprises a chalcogenide alloy, the desired threshold voltage corresponding to a logic state of the self-selecting memory cell representing one or more bits of data. The operations of block 1105 may be performed according to the methods described herein. In certain examples, aspects of the operations of block 1105 may be performed by a programming component as described with reference to FIGS. 7 through 9.

At block 1110 the memory device 100 may determine a shape of a programming pulse having a single polarity producing a current flowing through the self-selecting memory cell in order to obtain the desired threshold voltage of the self-selecting memory cell. The operations of block 1110 may be performed according to the methods described herein. In certain examples, aspects of the operations of block 1110 may be performed by a programming component as described with reference to FIGS. 7 through 9.

At block 1115 the memory device 100 may alter a spatial distribution of at least one part of the chalcogenide alloy along a direction of the current by applying the programming pulse to the self-selecting memory cell based at least in part on determining the shape of the programming pulse, wherein the desired threshold voltage of the self-selecting memory cell is based at last in part on the spatial distribution of the at least one part of the chalcogenide alloy. The operations of block 1115 may be performed according to the methods described herein. In certain examples, aspects of the operations of block 1115 may be performed by a biasing component as described with reference to FIGS. 7 through 9.

In some cases, the method 1100 may also include determining a desired threshold voltage of a self-selecting memory cell that comprises a chalcogenide alloy, the desired threshold voltage corresponding to a logic state of the self-selecting memory cell representing one or more bits of data. In some cases, the method 1100 may also include determining a shape of a programming pulse having a single polarity producing a current flowing through the self-selecting memory cell in order to obtain the desired threshold voltage of the self-selecting memory cell. In some cases, the method 1100 may also include applying the programming pulse to the self-selecting memory cell based at least in part on determining the shape of the programming pulse to alter a spatial distribution of at least one part of the chalcogenide alloy along a direction of the current, wherein the desired threshold voltage of the self-selecting memory cell is based at last in part on the spatial distribution of the at least one part of the chalcogenide alloy.

In some cases, determining the shape of the programming pulse comprises: determining one or more time durations during which a fixed voltage amplitude is maintained to produce the current flowing through the self-selecting memory cell during each time duration. In some cases, applying the programming pulse to the self-selecting memory cell comprises establishing an electric field across the chalcogenide alloy based at least in part on the fixed voltage amplitude to cause net movements of the at least one part of the chalcogenide alloy. In some cases, the method 1100 may also include heating the chalcogenide alloy based at least in part on the current flowing through the self-selecting memory cell to assist the net movements of the at least one part of the chalcogenide alloy. In some cases, the method 1100 may also include setting the desired threshold voltage of the self-selecting memory cell based at least in part on a concentration of the at least one part of the chalcogenide alloy at either the first interface or the second interface. In some cases, the method 1100 may also include applying one or more read pulses having the same polarity as the programming pulse. In some cases, the method 1100 may also include determining the logic state of the self-selecting memory cell based at least in part on applying the one or more read pulses that detect the threshold voltage of the self-selecting memory cell.

In some embodiments, an apparatus for accessing a self-selecting memory device is described. The apparatus may include means for determining a desired threshold voltage of a self-selecting memory cell that comprises a chalcogenide alloy, the desired threshold voltage corresponding to a logic state of the self-selecting memory cell representing one or more bits of data, means for determining a shape of a programming pulse having a single polarity producing a current flowing through the self-selecting memory cell in order to obtain the desired threshold voltage of the self-selecting memory cell, and means for applying the programming pulse to the self-selecting memory cell based at least in part on determining the shape of the programming pulse to alter a spatial distribution of at least one part of the chalcogenide alloy along a direction of the current, wherein the desired threshold voltage of the self-selecting memory cell is based at last in part on the spatial distribution of the at least one part of the chalcogenide alloy.

In some cases, the apparatus may further include means for setting the desired threshold voltage of the self-selecting memory cell based at least in part on a concentration of the at least one part of the chalcogenide alloy at either the first interface or the second interface where the self-selecting memory cell includes a first interface between a first electrode in contact with a first side of the chalcogenide alloy and a second interface between a second electrode in contact with a second side of the chalcogenide alloy. In some cases, the apparatus may further include means for applying one or more read pulses having the same polarity as the programming pulse, and means for determining the logic state of the self-selecting memory cell based at least in part on applying the one or more read pulses that detect the threshold voltage of the self-selecting memory cell.

Figure 12:
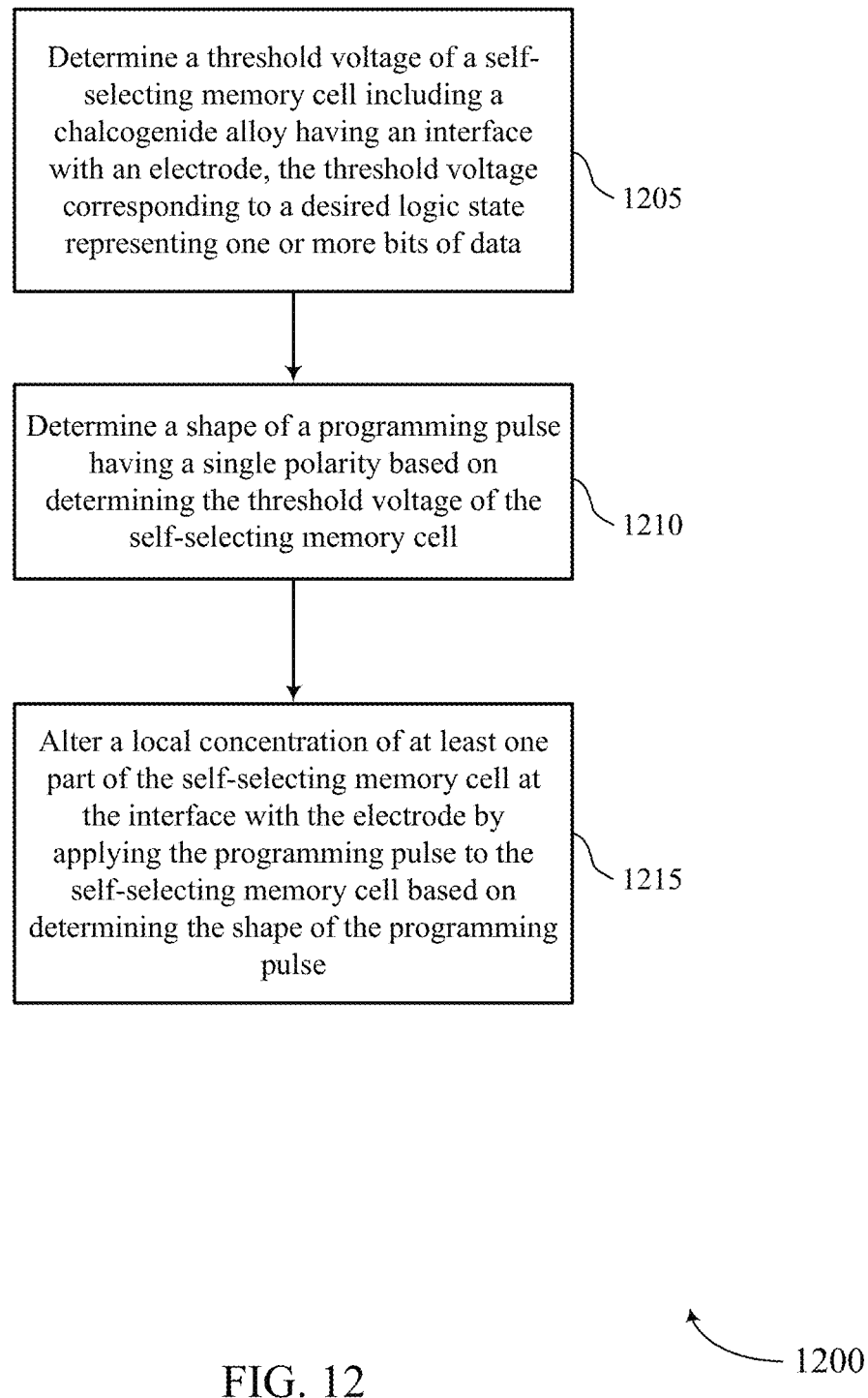

FIG. 12 shows a flowchart illustrating a method 1200 for accessing a self-selecting memory device in accordance with embodiments of the present disclosure. The operations of method 1200 may be implemented by a memory device 100 or its components as described herein. For example, the operations of method 1200 may be performed by a memory controller as described with reference to FIGS. 1 and 7 through 9. In some embodiments, the memory device 100 may execute a set of codes to control the functional elements of the device to perform the functions described below. Additionally or alternatively, the memory device 100 may perform aspects of the functions described below using special-purpose hardware.

At block 1205 the memory device 100 may determine a threshold voltage of a self-selecting memory cell including a chalcogenide alloy having an interface with an electrode, the threshold voltage corresponding to a desired logic state representing one or more bits of data. The operations of block 1205 may be performed according to the methods described herein. In certain examples, aspects of the operations of block 1205 may be performed by a programming component as described with reference to FIGS. 7 through 9.

At block 1210 the memory device 100 may determine a shape of a programming pulse having a single polarity based at least in part on determining the threshold voltage of the self-selecting memory cell. The operations of block 1210 may be performed according to the methods described herein. In certain examples, aspects of the operations of block 1210 may be performed by a programming component as described with reference to FIGS. 7 through 9.

At block 1215 the memory device 100 may alter a local concentration of at least one part of the self-selecting memory cell at the interface with the electrode by applying the programming pulse to the self-selecting memory cell based at least in part on determining the shape of the programming pulse. The operations of block 1215 may be performed according to the methods described herein. In certain examples, aspects of the operations of block 1215 may be performed by a biasing component as described with reference to FIGS. 7 through 9.

In some cases, the method 1200 may also include determining a threshold voltage of a self-selecting memory (self-selecting memory) cell comprising a chalcogenide alloy having an interface with an electrode, the threshold voltage corresponding to a desired logic state representing one or more bits of data. In some cases, the threshold voltage of the self-selecting memory cell is set based at least in part on a local composition of the chalcogenide alloy at the interface. In some cases, the threshold voltage of the self-selecting memory cell is proportional to a concentration of at least one constituent of the chalcogenide alloy at the interface. In some cases, the method 1200 may also include determining a shape of a programming pulse having a single polarity based at least in part on determining the threshold voltage of the self-selecting memory cell. In some cases, the method 1200 may also include applying the programming pulse to the self-selecting memory cell based at least in part on determining the shape of the programming pulse.

In some embodiments, an apparatus for accessing a self-selecting memory device is described. The apparatus may include means for determining a threshold voltage of a self-selecting memory (self-selecting memory) cell comprising a chalcogenide alloy having an interface with an electrode, the threshold voltage corresponding to a desired logic state representing one or more bits of data, means for determining a shape of a programming pulse having a single polarity based at least in part on determining the threshold voltage of the self-selecting memory cell, and means for applying the programming pulse to the self-selecting memory cell based at least in part on determining the shape of the programming pulse.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory device 100.

Chalcogenide materials may be materials or alloys that include at least one of the elements S, Se, and Te. Amorphous chalcogenide materials may include alloys of S, Se, Te, Ge, As, Al, Si, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including a memory device 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   determining a desired threshold voltage of a self-selecting memory cell that comprises a chalcogenide alloy, the desired threshold voltage corresponding to a logic state of the self-selecting memory cell representing one or more bits of data;
   determining a shape of a programming pulse having a single polarity producing a current flowing through the self-selecting memory cell to obtain the desired threshold voltage of the self-selecting memory cell; and
   altering a spatial distribution of at least one part of the chalcogenide alloy along a direction of the current by applying the programming pulse to the self-selecting memory cell based at least in part on determining the shape of the programming pulse, wherein the desired threshold voltage of the self-selecting memory cell is based at last in part on the spatial distribution of the at least one part of the chalcogenide alloy.

2. The method of claim 1, wherein determining the shape of the programming pulse comprises:
   determining one or more time durations during which a fixed voltage amplitude is maintained to produce the current flowing through the self-selecting memory cell during each time duration.

3. The method of claim 1, wherein variations of the shape of the programming pulse produce different threshold voltages of the self-selecting memory cell.

4. The method of claim 3, wherein the variations of the shape of the programming pulse comprise a second voltage level greater than a first voltage level or a second current level greater than a first current level, and wherein the second voltage level or the second current level establishes a greater threshold voltage of the self-selecting memory cell than the first voltage level or the first current level.

5. The method of claim 1, wherein the chalcogenide alloy comprises at least one of silicon (Si), selenium (Se), arsenic (As), or germanium (Ge).

6. The method of claim 1, wherein applying the programming pulse to the self-selecting memory cell comprises:
   establishing an electric field across the chalcogenide alloy based at least in part on a fixed voltage amplitude to cause net movements of the at least one part of the chalcogenide alloy; and
   heating the chalcogenide alloy based at least in part on the current flowing through the self-selecting memory cell to assist the net movements of the at least one part of the chalcogenide alloy.

7. The method of claim 1, wherein the self-selecting memory cell comprises a first interface between a first electrode in contact with a first side of the chalcogenide alloy and a second interface between a second electrode in contact with a second side of the chalcogenide alloy, the method further comprising:
   setting the desired threshold voltage of the self-selecting memory cell based at least in part on a concentration of the at least one part of the chalcogenide alloy at either the first interface or the second interface.

8. The method of claim 7, wherein applying the programming pulse to the self-selecting memory cell comprises:
   producing an asymmetric spatial distribution of the at least one part of the chalcogenide alloy between the first interface and the second interface.

9. The method of claim 8, wherein the at least one part of the chalcogenide alloy producing the asymmetric spatial distribution is selenium (Se).

10. The method of claim 1, further comprising:
    applying one or more read pulses having the same polarity as the programming pulse; and
    determining the logic state of the self-selecting memory cell based at least in part on applying the one or more read pulses that detect a threshold voltage of the self-selecting memory cell.

11. An apparatus, comprising:
    a self-selecting memory cell that comprises a chalcogenide alloy, the self-selecting memory cell having a threshold voltage corresponding to a logic state of the self-selecting memory cell representing one or more bits of data;
    a first access line selectively couplable with the self-selecting memory cell;
    a second access line selectively couplable with the self-selecting memory cell; and
    a memory controller operable to:
      determine a desired threshold voltage of the self-selecting memory cell, the desired threshold voltage corresponding to the logic state;
      determine a shape of a programming pulse having a single polarity producing a current flowing through the self-selecting memory cell to obtain the desired threshold voltage of the self-selecting memory cell; and
      altering a spatial distribution of at least one part of the chalcogenide alloy along a direction of the current by applying the programming pulse to the self-selecting memory cell via the first access line and the second access line based at least in part on determining the shape of the programming pulse, wherein the desired threshold voltage of the self-selecting memory cell is based at last in part on the spatial distribution of the at least one part of the chalcogenide alloy.

12. The apparatus of claim 11, wherein determining the shape of the programming pulse further comprise the memory controller operable to:
    determine one or more time durations during which a fixed voltage amplitude is maintained to produce the current flowing through the self-selecting memory cell during each time duration.

13. The apparatus of claim 11, wherein variations of the shape of the programming pulse produce different threshold voltages of the self-selecting memory cell.

14. The apparatus of claim 13, wherein the variations of the shape of the programming pulse comprise a second voltage level greater than a first voltage level or a second current level greater than a first current level, and wherein the second voltage level or the second current level establishes a greater threshold voltage of the self-selecting memory cell than the first voltage level or the first current level.

15. The apparatus of claim 11, wherein the chalcogenide alloy comprises at least one of silicon (Si), selenium (Se), arsenic (As), or germanium (Ge).

16. The apparatus of claim 11, wherein applying the programming pulse to the self-selecting memory cell further comprises the memory controller operable to:
    establish an electric field across the chalcogenide alloy based at least in part on a fixed voltage amplitude to cause net movements of the at least one part of the chalcogenide alloy; and
    heat the chalcogenide alloy based at least in part on the current flowing through the self-selecting memory cell to assist the net movements of the at least one part of the chalcogenide alloy.

17. The apparatus of claim 11, wherein the self-selecting memory cell further comprises:
    a first interface between a first electrode in contact with a first side of the chalcogenide alloy and a second interface between a second electrode in contact with a second side of the chalcogenide alloy, wherein setting the desired threshold voltage of the self-selecting memory cell is based at least in part on a concentration of the at least one part of the chalcogenide alloy at either the first interface or the second interface.

18. The apparatus of claim 11, wherein the memory controller is further operable to:
    apply one or more read pulses having the same polarity as the programming pulse; and
    determine the logic state of the self-selecting memory cell based at least in part on applying the one or more read pulses that detect the threshold voltage of the self-selecting memory cell.

19. A method, comprising:
    determining a desired logic state of a self-selecting memory cell that comprises a chalcogenide alloy having an interface with an electrode, the desired logic state representing one or more bits of data;
    determining a desired threshold voltage of the self-selecting memory cell that corresponds to the desired logic state of the self-selecting memory cell;
    determining a shape of a programming pulse having a single polarity producing a current flowing through the self-selecting memory cell based at least in part on determining the desired threshold voltage; and
    altering a spatial distribution of at least one part of the chalcogenide alloy at the interface with the electrode by applying the programming pulse to the self-selecting memory cell based at least in part on determining the shape of the programming pulse.

20. The method of claim 19, wherein the desired threshold voltage of the self-selecting memory cell is based at last in part on the spatial distribution of the at least one part of the chalcogenide alloy.

* * * * *